United States Patent
Omura

(10) Patent No.: US 6,714,280 B2
(45) Date of Patent: Mar. 30, 2004

(54) PROJECTION OPTICAL SYSTEM, PROJECTION EXPOSURE APPARATUS, AND PROJECTION EXPOSURE METHOD

(75) Inventor: Yasuhiro Omura, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/079,519

(22) Filed: Feb. 22, 2002

(65) Prior Publication Data

US 2002/0186355 A1 Dec. 12, 2002

(30) Foreign Application Priority Data

Feb. 23, 2001 (JP) ..................................... P2001-049306
Aug. 24, 2001 (JP) ..................................... P2001-254704

(51) Int. Cl.⁷ .......................... G03B 27/42; G03B 27/54
(52) U.S. Cl. ............................................. 355/53; 355/67
(58) Field of Search .............................. 355/53, 67–71; 359/365, 728–729; 372/19–20

(56) References Cited

U.S. PATENT DOCUMENTS

| | | | | |
|---|---|---|---|---|
| 4,883,352 A | * | 11/1989 | Bruning | 353/122 |
| 6,088,171 A | | 7/2000 | Kudo | 359/754 |
| 6,157,498 A | * | 12/2000 | Takahashi | 359/728 |
| 6,377,338 B1 | * | 4/2002 | Suenaga | 355/67 |
| 6,426,966 B1 | * | 7/2002 | Basting et al. | 372/19 |
| 6,451,507 B1 | * | 9/2002 | Suenaga et al. | 430/311 |

FOREIGN PATENT DOCUMENTS

| | | |
|---|---|---|
| EP | 0 828 172 | 3/1998 |
| EP | 1 006 373 | 6/2000 |
| EP | 1 006 387 | 6/2000 |
| EP | 1 006 388 | 6/2000 |
| EP | 1 006 389 | 6/2000 |
| EP | 1 037 267 | 9/2000 |
| EP | 1 061 396 | 12/2000 |
| EP | 1 139 138 | 10/2001 |
| JP | 2000-121934 | 4/2000 |
| JP | 2000-356741 | 12/2000 |
| JP | 2000-357645 | 12/2000 |
| JP | 2001-023887 | 1/2001 |
| WO | WO 00/33138 | 6/2000 |
| WO | WO 00/70407 | 11/2000 |

* cited by examiner

Primary Examiner—Henry Hung Nguyen

(57) ABSTRACT

A projection optical system transferring a mask image on a mask onto a substrate and correcting chromatic aberration. A projection exposure system includes at least two refractive optical members collectively containing at least a first fluoride substance and a second fluoride substance, and satisfying the design condition $$0.4 < \frac{MX_2}{MX_1} < 0.87,$$

where $MX_1$ is the effective aperture of the surfaces having the largest effective aperture from among the surfaces of the refractive optical members containing the first fluoride substance, $MX_2$ is the effective aperture of the surfaces having the largest effective aperture from among the surfaces of the refractive optical members containing the second fluoride substance, and $MX_1$ is greater than $MX_2$. A projection exposure apparatus includes the projection optical system and a light source supplying radiation having a natural linewidth that is incident on a linewidth narrowing unit to provide radiation for exposure having a linewidth narrower than the natural linewidth.

36 Claims, 10 Drawing Sheets

PROJECTION OPTICAL SYSTEM, PROJECTION EXPOSURE APPARATUS, AND PROJECTION EXPOSURE METHOD

BACKGROUND OF THE INVENTION

The present invention pertains to a projection exposure apparatus and method which may be employed, for example, where photolithographic techniques are used for manufacture of semiconductor integrated circuits, charge coupled devices and other such image pickup elements, liquid crystal display devices, thin-film magnetic heads, and other such microdevices, and pertains as well to a projection optical system suitable for use in such a projection exposure apparatus or method. The present invention permits a projection optical system to be provided which is capable of high-resolution projection of a highly detailed pattern while permitting satisfactory correction of chromatic aberration and without incurring inordinate increase in cost. Furthermore, the present invention permits a projection exposure apparatus and a projection exposure method to be provided which permit satisfactory transfer of an image of an extremely detailed pattern from a mask to a substrate.

More particularly, one or more embodiments of the present invention employ a combination of techniques for facilitating correction of chromatic aberration in the context of a projection optical system comprising one or more refractive optical members collectively comprising two or more fluoride substances. Still more particularly, one or more embodiments of the present invention utilize one or more design conditions pertaining to an illumination optical system (including light source) and/or a projection optical system for economical and/or effective allocation of such fluoride substances.

One application of projection exposure apparatuses is in photolithographic operations for manufacture of semiconductor elements or the like, where an image of a pattern on a mask, reticle, or the like (hereinafter referred to collectively as "mask," "reticle," etc., these terms being used interchangeably where not otherwise specified) is projected by way of a projection optical system to expose resist or other such photosensitive material on a wafer, glass or other such plate, substrate, workpiece, or the like (hereinafter referred to collectively as "substrate," "wafer," "workpiece," etc., these terms being used interchangeably where not otherwise specified). Accompanying the desire to achieve increased circuit density of semiconductor elements and the like, higher and higher resolutions are being required of the projection optical systems used in projection exposure apparatuses.

Resolution of an optical system is in general determined by Rayleigh's equation, or $$R = k \times \frac{\lambda}{NA},$$

where $\lambda$ is the exposing wavelength, NA is the image-side numerical aperture of the projection optical system, and k is a constant which is in this case determined by resist resolution and so forth. It is clear from the above equation that resolution can be increased by decreasing the wavelength of the actinic light or radiation responsible for exposure ("light" and "radiation" are used interchangeably herein and without intention to limit either to wavelengths which are visible or invisible or the like; "actinic" light or radiation as used herein refers to light or radiation used for exposure without regard to whether such exposure occurs by a chemical, physical, or other process; "exposure" as used herein refers to any change due to receipt of such actinic light or radiation at the wafer or other such substrate or workpiece) or by increasing numerical aperture. Based on this fact, the mercury lamp i-line light sources (wavelength 365 nm) which had previously been favored by the industry have been largely replaced by the KrF excimer laser (wavelength 248 nm), and the still-shorter-wavelength ArF laser (wavelength 193 nm) is well on its way to practical application. In addition, with the goal of even further reduction in the wavelength of the light used for exposure, attempts are underway to develop an exposure apparatus utilizing an $F_2$ laser (wavelength 157 nm).

However, increasing the numerical aperture of a projection optical system decreases it depth of focus. This in turn places stringent demands on the projection optical system with respect to correction of chromatic aberration. Furthermore, as a result of developments in resist and other peripheral technologies, the magnitude of k in the above equation has grown smaller over time. Minor aberrations and small errors in exposure dose can therefore have a large effect on resolution, and chromatic aberration must be even more tightly controlled.

One strategy which has been proposed for accomplishing such goals is the use of an exposure apparatus employing actinic radiation having a narrowed linewidth. However, where the refractive optical members in the projection optical systems of such proposed exposure apparatuses are formed from a single substance there will be a limit as to how far chromatic aberration can be corrected, making such apparatuses incapable of providing the resolutions now in demand. Furthermore, achieving narrowed linewidth is not an easy matter, and it is only with great difficulty that narrowing sufficient to permit reduction of chromatic aberration to the desired level can be achieved in the context of a projection optical system employing refractive optical members composed of a single substance. There is therefore a need for a projection optical system having optical members formed from a plurality of substances to permit further improvement in ability to correct for chromatic aberration.

However, with a light source employing an $F_2$ laser, there are only a limited number of materials which are effective in reducing chromatic aberration, permit achievement of satisfactory transmittance, and do not present significant problems with respect to fabrication and endurance. At present, one set of materials that satisfies all of the above requirements is a combination of calcium fluoride and barium fluoride. However, barium fluoride has high specific gravity and does not lend itself to fabrication into parts having good homogeneity, and its high solvability with respect to water makes it less than suitable for fabrication. In light of the foregoing, there has been a problem in that any increase in the amount of barium fluoride in an attempt to correct chromatic aberration would lead to increased cost.

SUMMARY OF THE INVENTION

The present invention pertains to a projection exposure apparatus and method which may be employed, for example, where photolithographic techniques are used for manufacture of semiconductor integrated circuits, charge coupled devices and other such image pickup elements, liquid crystal display devices, thin-film magnetic heads, and other such microdevices, and pertains as well to a projection optical system suitable for use in such a projection exposure apparatus or method. The present invention permits a projection optical system to be provided which is capable of high-resolution projection of a highly detailed pattern while permitting satisfactory correction of chromatic aberration and without incurring inordinate increase in cost. Furthermore, the present invention permits a projection exposure apparatus and a projection exposure method to be provided which permit satisfactory transfer of an image of an extremely detailed pattern from a mask to a substrate.

More particularly, one or more embodiments of the present invention employ a combination of techniques for facilitating correction of chromatic aberration in the context of a projection optical system comprising one or more refractive optical members collectively comprising two or more fluoride substances. Still more particularly, one or more embodiments of the present invention utilize one or more design conditions pertaining to an illumination optical system (including light source) and/or a projection optical system for economical and/or effective allocation of such fluoride substances.

In order to solve one or more of the foregoing or related problems, a projection optical system associated with one aspect of the present invention is capable of projecting to an image space an image of an object in an object space, the system comprising at least one first refractive optical member comprising a first fluoride substance and at least one second refractive optical member comprising a second fluoride substance, wherein $MX_1$ is greater than $MX_2$ and the design condition $$0.4 < \frac{MX_2}{MX_1} < 0.87$$

is satisfied, where $MX_1$ is the effective aperture of the surface or surfaces having the largest effective aperture among the surface or surfaces of the first refractive optical member or members, and $MX_2$ is the effective aperture of the surface or surfaces having the largest effective aperture among the surface or surfaces of the second refractive optical member or members.

It is preferred in the present invention that the first fluoride substance be calcium fluoride, and that the second fluoride substance be barium fluoride. Furthermore, it is preferred in the present invention that the projection optical system furthermore comprise at least one positive lens component and at least one negative lens component, and that at least one of the positive lens component or components comprise the first fluoride substance, and that at least one of the negative lens component or components comprise the second fluoride substance. Moreover, it is preferred in the present invention that each of the lens components of the projection optical system respectively consist of only the first fluoride substance or the second fluoride substance or both. In addition, it is preferred in the present invention that the f-number of the second refractive optical member or the respective f-numbers of each of the second refractive optical members satisfy the design condition $0.8<|FN_i|$, where $FN_i$ represents each such f-number.

In order to solve one or more of the foregoing or related problems, a projection exposure apparatus associated with another aspect of the present invention is capable of transferring onto a substrate an image of a pattern on a mask, the apparatus comprising a light source capable of supplying radiation for exposure, an illumination optical system arranged to receive at least some of the radiation from the light source and guide at least some of the received radiation to the mask, and a projection optical system as described above, wherein the mask is capable of being disposed in the object space, and the substrate is capable of being disposed in the image space.

It is preferred in the present invention that such a projection exposure apparatus be capable of transferring onto a substrate an image of a pattern on a mask, the apparatus comprising a light source capable of supplying radiation for exposure, an illumination optical system arranged to receive at least some of the radiation from the light source and guide at least some of the received radiation to the mask, and a projection optical system capable of forming on the substrate an image of the pattern on the mask in correspondence to radiation received from the mask, and that the projection optical system comprise one or more refractive optical members collectively comprising at least two fluoride substances, and that a linewidth of the radiation from the light source be narrower than a natural linewidth thereof.

Furthermore, it is preferred in such a projection exposure apparatus associated with the present invention that each of the refractive optical members within such projection optical system respectively comprise one or more fluoride substances. Moreover, it is preferred in such a projection exposure apparatus associated with the present invention that the at least two fluoride substances collectively include calcium fluoride and barium fluoride.

In addition, it is preferred in such a projection exposure apparatus associated with the present invention that the at least two fluoride substances collectively include a first fluoride substance and a second fluoride substance which are such that $MX_1$ is greater than $MX_2$, and the design condition $$0.4 < \frac{MX_2}{MX_1} < 0.87$$

is satisfied, where $MX_1$ is the effective aperture of the surface or surfaces having the largest effective aperture among the surface or surfaces of the refractive optical member or members comprising the first fluoride substance, and $MX_2$ is the effective aperture of the surface or surfaces having the largest effective aperture among the surface or surfaces of the refractive optical member or members comprising the second fluoride substance. Furthermore, it is preferred in such a projection exposure apparatus associated with the present invention that the projection optical system furthermore comprise at least one positive lens component and at least one negative lens component, and that at least one of the positive lens component or components comprise the first fluoride substance, and that at least one of the negative lens component or components comprise the second fluoride substance.

Moreover, it is preferred in such a projection exposure apparatus associated with the present invention that the at least two fluoride substances collectively include a first fluoride substance and a second fluoride substance, and that the f-number or the respective f-numbers of the refractive optical member or members comprising the second fluoride substance satisfy the design condition $0.8<|FN_i|$, where $FN_i$ represents each such f-number.

In addition, it is preferred in such a projection exposure apparatus associated with the present invention that a linewidth of the radiation from the light source be not more than about half of a natural linewidth thereof as measured on a full-width-at-half-maximum basis. Furthermore, it is preferred in such a projection exposure apparatus associated with the present invention that the light source comprise an $F_2$ laser. Moreover, it is preferred in such a projection exposure apparatus associated with the present invention that the light source comprise an oscillator capable of generating radiation having a linewidth narrower than a natural linewidth thereof, and an amplifier capable of amplifying the output of the radiation generated by the oscillator. In addition, it is preferred in such a projection exposure apparatus associated with the present invention that a linewidth of the radiation supplied by the light source be not more than about 0.3 pm as measured on a full-width-at-half-maximum basis. Furthermore, it is still more preferred in such a projection exposure apparatus associated with the present invention that a linewidth of the radiation supplied by the light source be not more than about 0.2 pm as measured on a full-width-at-half-maximum basis.

Moreover, it is preferred in such a projection exposure apparatus associated with the present invention that the at least two fluoride substances collectively include two species selected from among the group consisting of calcium fluoride, barium fluoride, lithium fluoride, magnesium fluoride, strontium fluoride, lithium calcium aluminum fluoride, and lithium strontium aluminum fluoride.

In order to solve one or more of the foregoing or related problems, a projection exposure method associated with another aspect of the present invention is a method for transferring onto a substrate an image of a pattern on a mask, the method using a projection exposure apparatus as described above to form on the substrate an image of the pattern on the mask.

BRIEF DESCRIPTION OF DRAWINGS

These and other features, aspects, and advantages of the present invention will become better understood with reference to the following description, appended claims, and accompanying drawings where:

DESCRIPTION OF THE PREFERRED EMBODIMENTS

Figure 1:
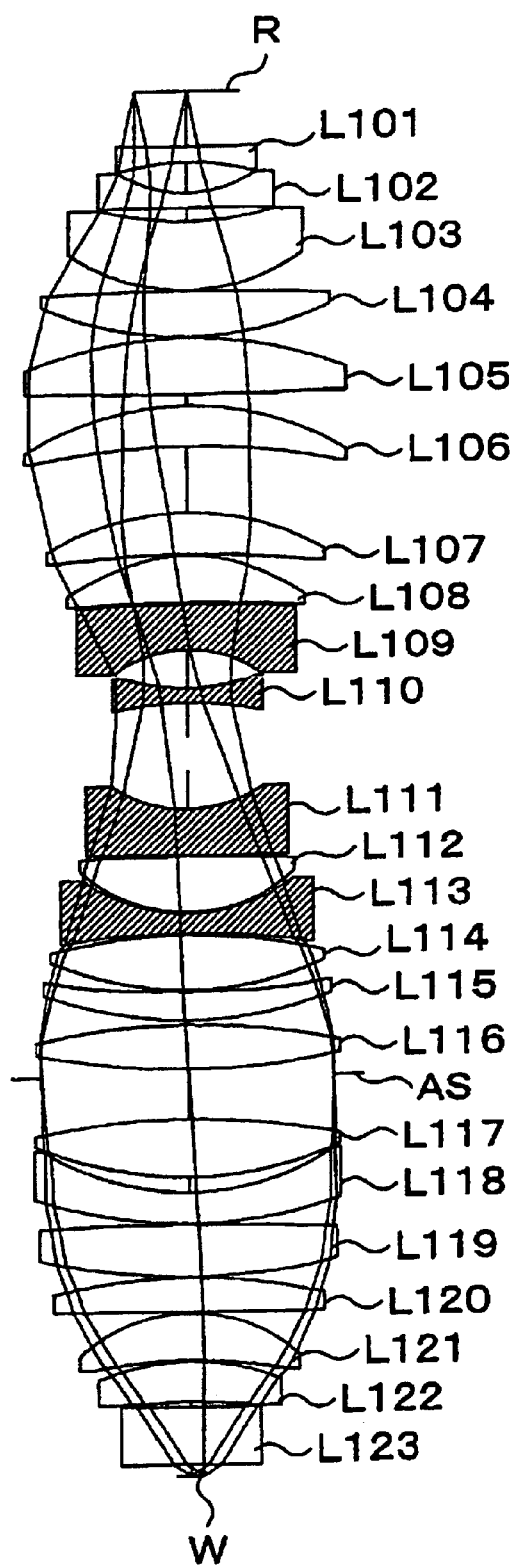
FIG. 1 is an optical path diagram showing a projection optical system in a first working example of an embodiment associated with one or more aspects of the present invention.

The present invention pertains to a projection exposure apparatus and method which may be employed, for example, where photolithographic techniques are used for manufacture of semiconductor integrated circuits, charge coupled devices and other such image pickup elements, liquid crystal display devices, thin-film magnetic heads, and other such microdevices, and pertains as well to a projection optical system suitable for use in such a projection exposure apparatus or method. The present invention permits a projection optical system to be provided which is capable of high-resolution projection of a highly detailed pattern while permitting satisfactory correction of chromatic aberration and without incurring inordinate increase in cost. Furthermore, the present invention permits a projection exposure apparatus and a projection exposure method to be provided which permit satisfactory transfer of an image of an extremely detailed pattern from a mask to a substrate.

More particularly, one or more embodiments of the present invention employ a combination of techniques for facilitating correction of chromatic aberration in the context of a projection optical system comprising one or more refractive optical members collectively comprising two or more fluoride substances. Still more particularly, one or more embodiments of the present invention utilize one or more design conditions pertaining to an illumination optical system (including light source) and/or a projection optical system for economical and/or effective allocation of such fluoride substances.

As described above, in accordance with one aspect of the present invention a projection exposure system comprises at least two refractive optical members collectively comprising at least a first fluoride substance and a second fluoride substance, wherein $MX_1$ is greater than $MX_2$ and the design condition $$0.4 < \frac{MX_2}{MX_1} < 0.87 \tag{1}$$

is satisfied, where $MX_1$ is the effective aperture of the surface or surfaces having the largest effective aperture among the surface or surfaces of the refractive optical member or members comprising the first fluoride substance, and $MX_2$ is the effective aperture of the surface or surfaces having the largest effective aperture among the surface or surfaces of the refractive optical member or members comprising the second fluoride substance.

Because lens component or components in a projection optical system constituted in such fashion employ at least two fluoride substances, refractive optical members therein may comprise substances having mutually different dispersion characteristics, thus permitting achievement of satisfactory correction of chromatic aberration. Condition (1) defines a range of relative effective apertures associated with such dissimilar substances, the limits specified therein representing a design rule for striking a suitable balance between such goals as correction of chromatic aberration and such constraints as the difficulty of manufacturing optical members with good homogeneity and the difficulty of manufacturing lenses of large diameter. When $$\frac{MX_2}{MX_1}$$

falls below the lower limit of condition (1), it will be difficult to achieve adequate correction of chromatic aberration. Furthermore, when $$\frac{MX_2}{MX_1}$$

exceeds the upper limit in condition (1), lens fabrication will be problematic depending on the material or materials employed (here, the terms "fabrication" and "manufacture" should be understood in a very broad sense to include such issues as scarcity of material and cost, as well as specific fabrication issues related to shaping, lapping, polishing, optical surface generation, etc.). In a preferred embodiment, $$\frac{MX_2}{MX_1}$$

at condition (1) is moreover not less than about 0.5 and not more than about 0.84.

In a preferred embodiment, the first fluoride substance is calcium fluoride, and the second fluoride substance is barium fluoride. The materials calcium fluoride and barium fluoride permit achievement of satisfactory transmittance and are effective in reducing chromatic aberration when a light source employing an $F_2$ laser is used. Because barium fluoride does not lend itself to fabrication into parts having good homogeneity and because it is difficult to fabricate a lens of large diameter therefrom, it is preferred that in designing the optical system to correct for chromatic aberration this be done such that barium fluoride is employed in the lens or lenses of comparatively small diameter. Adoption of such a design rule will facilitate optical fabrication and prevent inordinate increase in cost.

Furthermore, in a preferred embodiment, the projection optical system furthermore comprises at least one positive lens component and at least one negative lens component, at least one of the positive lens component or components comprising the first fluoride substance, and at least one of the negative lens component or components comprising the second fluoride substance. Adoption of such a design rule makes it possible for a positive lens component or components and a negative lens component or components to respectively comprise substances having mutually different dispersion characteristics, permitting more satisfactory correction of chromatic aberration.

Furthermore, it is preferred for correction of chromatic aberration that a positive lens component or components comprise a substance or substances of small dispersion and that a negative lens component or components comprise a substance or substances of large dispersion. This being the case, in embodiments of the present invention in which calcium fluoride and barium fluoride are for example used, it is preferred that a positive lens component or components comprise calcium fluoride and that a negative lens component or components comprise barium fluoride, or putting this slightly differently it is preferred that the first fluoride substance be calcium fluoride and the second fluoride substance be barium fluoride. Selecting calcium fluoride as the first fluoride substance and selecting barium fluoride as the second fluoride substance will for example permit condition (1) to be satisfied. And when calcium fluoride is for example selected as the first fluoride substance and barium fluoride is for example selected as the second fluoride substance, an optical system constructed such that condition (1) is satisfied will display good effect with respect to manufacturability and correction of chromatic aberration.

Furthermore, in a preferred embodiment, each of the lens components of the projection optical system respectively consists of only the first fluoride substance or the second fluoride substance or both. Because there are fluoride substances which possess adequate transmittance with respect to light of wavelength 200 nm or less, use of such fluoride substances makes it possible to reduce absorption of actinic light by refractive optical members within the projection optical system, in some cases to the point where such absorption has on the order of negligible effect on the projection optical system. Furthermore, while variations in irradiance are sometimes observed when synthetic quartz is used as lens material, such effects can be reduced or avoided with fluoride substances. Moreover, such features of the present invention permit achievement of an optical system capable of accommodating an $F_2$ laser while still permitting correction of chromatic aberration.

Furthermore, in a preferred embodiment of a projection optical system associated with the present invention, the design condition $$0.8 < |FN_i| \tag{2}$$

is satisfied, where $FN_i$ represents the f-number of the refractive optical member comprising the second fluoride substance or the respective f-numbers of each of the second refractive optical members comprising the second fluoride substance. As used herein, f-number $FN_i$ is defined as $$FN_i = \frac{f_i}{CL_i},$$

where $f_i$ represents the focal length of the refractive optical member in question, and $CL_i$ represents the effective aperture (expressed as a diameter) of the refractive optical member in question. Satisfaction of condition (2) permits achievement of good imaging while allowing stable correction of chromatic aberration. Moreover, in such a preferred embodiment it is preferred for correction of chromatic aberration that at least one refractive optical member comprising the second fluoride substance comprise a negative lens. In such a preferred embodiment, while making the f-number or f-numbers of such lens or lenses smaller (i.e., allowing more light to pass therethrough) will facilitate correction of chromatic aberration, decreasing f-number thereof to the point where condition (2) is no longer satisfied is not preferred because it will make stable achievement of good imaging difficult and it will aggravate the problem of variation in aberration in the event of decentration of such refractive optical member or members. It is still more preferred for even more stable attainment of good imaging that $|FN_i|$ at condition (2) be moreover not less than about 0.9.

Furthermore, in accordance with another aspect of the present invention, an exposure apparatus is capable of transferring onto a substrate an image of a pattern on a mask, the apparatus comprising a light source capable of supplying radiation for exposure, an illumination optical system arranged to receive at least some of the radiation from the light source and guide at least some of the received radiation to the mask, and a projection optical system as described above, wherein the mask is capable of being disposed in the object space and the substrate is capable of being disposed in the image space. Because such a projection exposure apparatus employs a projection optical system permitting satisfactory correction of chromatic aberration as described above, it is possible to transfer of an image of an extremely detailed pattern from a mask to a substrate with high resolution.

Furthermore, in accordance with another aspect of the present invention, an exposure apparatus is capable of transferring onto a substrate an image of a pattern on a mask, the apparatus comprising a light source capable of supplying radiation for exposure, an illumination optical system arranged to receive at least some of the radiation from the light source and guide at least some of the received radiation to the mask, and a projection optical system capable of forming on the substrate an image of the pattern on the mask in correspondence-to radiation received from the mask, wherein the projection optical system comprises one or more refractive optical members collectively comprising at least two fluoride substances, and a linewidth of the radiation from the light source is narrower than a natural linewidth thereof.

Because the projection optical system in a projection exposure apparatus constituted in such fashion comprises one or more refractive optical members collectively comprising at least two fluoride substances, satisfactory correction of chromatic aberration is permitted. Furthermore, because in at least a preferred embodiment a linewidth of the radiation from the light source is narrower than a natural linewidth thereof, even greater effect with respect to correction of chromatic aberration is permitted. Employment of such a constitution therefore makes it possible to transfer an image of an extremely detailed pattern from a mask to a substrate with even higher resolution. Such a projection exposure apparatus in accordance with the present invention may for example employ a projection optical system as described above.

In a preferred embodiment, a linewidth of the radiation from the light source is not more than about half of a natural linewidth thereof as measured on a full-width-at-half-maximum basis. Employment of such narrowed light source makes it possible to achieve adequate correction of chromatic aberration with smaller quantities of a substance or substances, e.g. barium fluoride, used for correction of chromatic aberration than would be the case otherwise, or alternatively, permits still better correction of chromatic aberration where the quantities of such substance or substances are not reduced. Such strategies therefore permit attainment of a projection exposure apparatus capable of satisfactory correction of chromatic aberration without an inordinate increase in cost. It is furthermore preferred in the present invention that such light source comprise an $F_2$ laser. Employment of an $F_2$ laser, because of the short wavelength produced thereby, will facilitate high-resolution imaging of the mask pattern onto the substrate.

It is preferred in the present invention that such light source comprise an oscillator capable of generating radiation having a linewidth narrower than a natural linewidth thereof, and an amplifier capable of amplifying the output of the radiation generated by the oscillator. Employment of an amplifier will facilitate the obtaining of radiation in useful quantities despite any reduction in light source output occurring due to narrowing of linewidth. As such amplifier, a device utilizing MOPA (Master Oscillator and Power Amplifier) technology, an injection-locking-type device such as is disclosed at Japanese Patent Application Publication Kokai No. H13-24265 (2001), or any other suitable device may be used, as will be described in further detail below.

Furthermore, it is preferred in the present invention that a linewidth of the radiation supplied by such light source be not more than about 0.3 pm as measured on a full-width-at-half-maximum basis. Moreover, it is still more preferred that a linewidth of the radiation supplied by such light source be not more than about 0.2 pm as measured on a full-width-at-half-maximum basis. Such narrowed linewidth facilitates correction of chromatic aberration and permits an image of the mask pattern to be formed with still higher resolution.

Furthermore, in accordance with another aspect of the present invention, a projection exposure method is employed to transfer onto a substrate an image of a pattern on a mask, the method comprising readying the mask for exposure, readying the substrate for exposure, and using a projection exposure apparatus as described above to form on the substrate an image of the pattern on the mask. Employment of such a method permits satisfactory transfer of a highly detailed pattern to a substrate.

Figure 2:
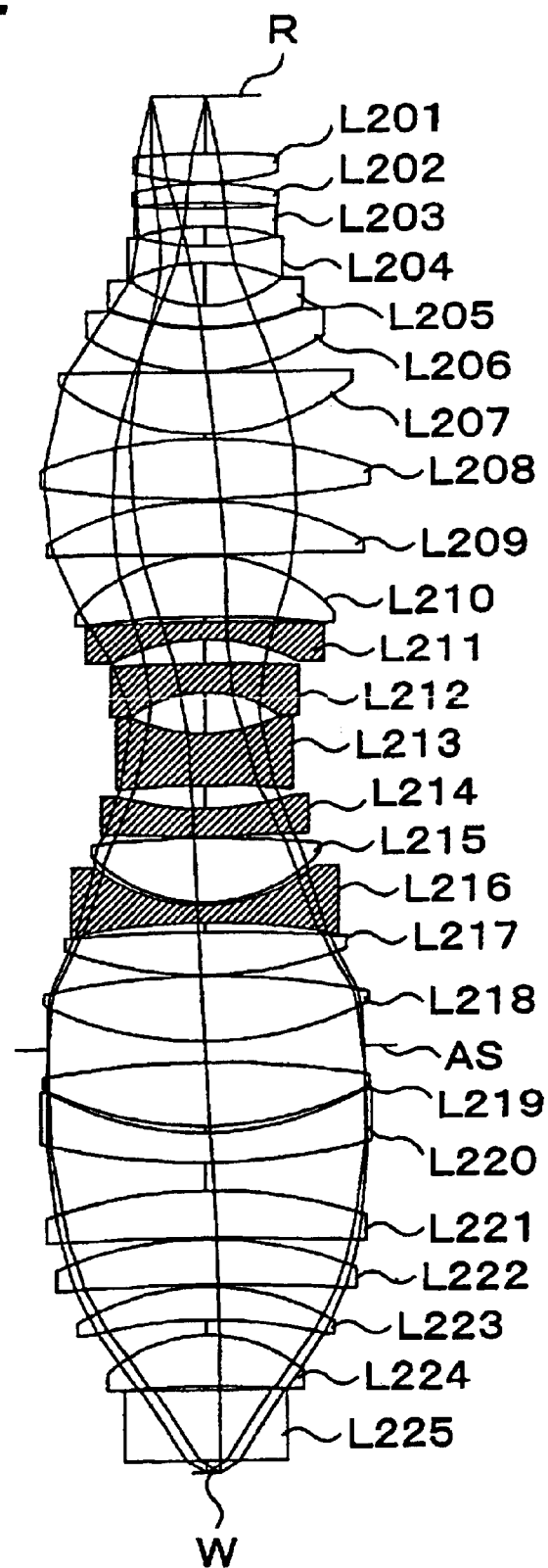
FIG. 2 is an optical path diagram showing a projection optical system in a second working example of an embodiment associated with one or more aspects of the present invention.
Figure 3:
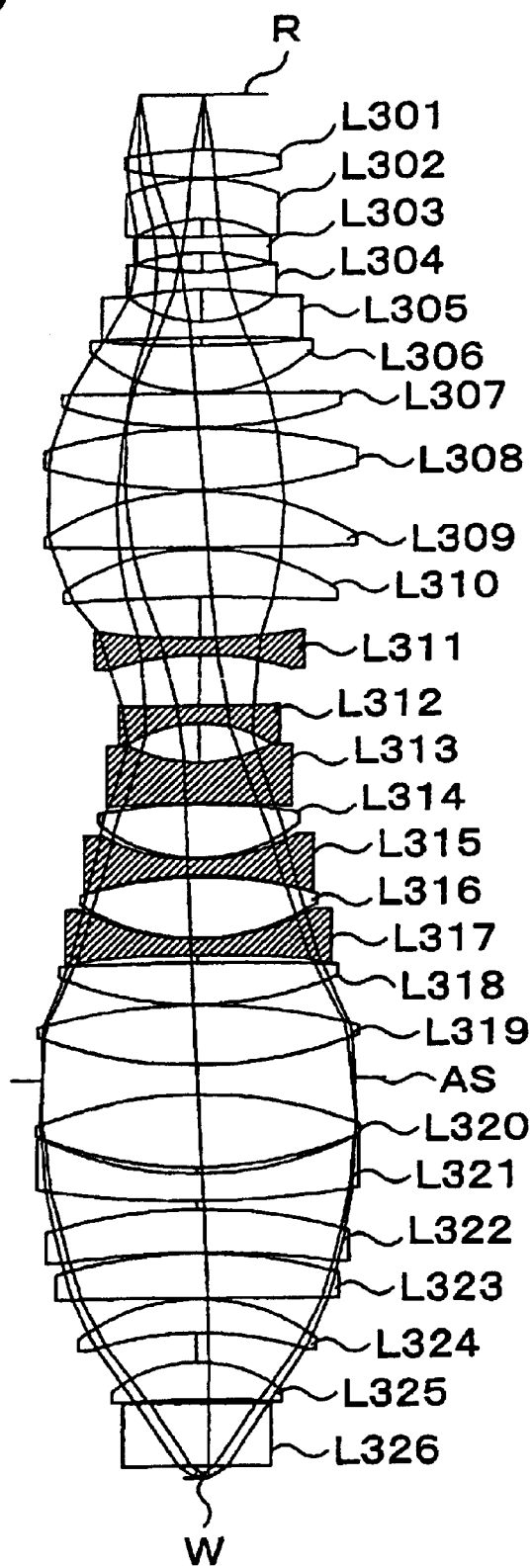
FIG. 3 is an optical path diagram showing a projection optical system in a third working example of an embodiment associated with one or more aspects of the present invention.

Below, several exemplary embodiments of the present invention are described in detail with reference to the drawings and through presentation of specific quantitative working examples. FIGS. 1 through 3 are drawings, not necessarily to scale, showing schematically the respective optical paths in respective projection optical systems PL associated with several embodiments of the present invention. The projection optical systems in the examples shown in FIGS. 1 through 3 each comprise refractive optical members and are capable of projecting onto a wafer W serving as substrate and disposed in an image plane serving as image space a reduced image of a pattern on a reticle R serving as mask and disposed in an object plane serving as object space. The projection optical systems in the embodiments shown further each comprise at least one aperture stop AS (one such aperture stop AS being shown at each drawing) which is arranged at a location along the optical path thereof.

Below, various exemplary design values are given for specific working examples of embodiments of the projection optical systems PL shown schematically in FIGS. 1 through 3. These specific numerical examples are presented for descriptive purposes only and the invention should not be interpreted as being limited thereby.

WORKING EXAMPLE 1

FIG. 1 shows the optical path in a projection optical system PL in a first working example of an embodiment associated with one aspect of the present invention. Referring to FIG. 1, the projection optical system PL of the present working example may be designed to provide satisfactory correction of chromatic aberration within a range suitable, for example, for use with an $F_2$ laser light source supplying light having a linewidth of, for example, 0.25 pm as measured on a full-width-at-half-maximum (hereinafter "FWHM") basis about a center wavelength of 157.62 nm. In the present example, the projection optical system PL comprises 23 lenses L101, L102, . . . L123, each of which respectively comprises a fluoride substance. As is indicated in the drawing, the height of a ray traveling along the optical path between the object plane and the image plane is markedly reduced in the vicinity of the more or less central region intermediate therebetween, permitting reduction in the effective aperture of the lenses in this region, and exploiting this fact, the present working example employs, for example, barium fluoride ($BaF_2$) in, for example, four negative lenses L109, L110, L111, L113 arranged in this general region. Furthermore, in the present working example, calcium fluoride ($CaF_2$) is employed in a positive lens L112 interposed between two of those four negative lenses, and is also employed in all of the other lenses in the projection optical system PL.

Design values pertaining to the projection optical system PL of Working Example 1 are presented in TABLE 1. In the table, NA indicates numerical aperture at the wafer W side, φ indicates the diameter of a, for example, circular region imaged on the wafer W, β indicates the magnification of the entire projection optical system, d0 indicates distance from the object plane (i.e., reticle plane) to the object-most (i.e., reticle-most) optical surface of the optical element in question, and WD indicates distance from the image-most (i.e., wafer-most) optical surface of the optical element in question to the image plane (i.e., wafer plane). Numbering of lenses as listed under "Lens No." at TABLE 1 follows the same convention as used for the lenses L101, L102, . . . , L123 shown in FIG. 1. Listed at TABLE 1 for each lens there are, in order from the column at the left: lens number, lens front surface radius of curvature, lens rear surface radius of curvature, distance along optical axis between optical surfaces, and material. As used herein, "front" (e.g., as used to distinguish between the two optical surfaces of a lens) refers to the side nearer to the reticle R, and "rear" refers to the side nearer to the wafer W. The sign of front surface radius of curvature is taken to be positive for surfaces that are convex as viewed from the reticle R side, and negative for surfaces that are concave as viewed from the reticle R side. The sign of rear surface radius of curvature is taken to be positive for surfaces that are concave as viewed from the reticle R side, and negative for surfaces that are convex as viewed from the reticle R side. In the table, A(1) through A(7) represent aspheric surfaces, and APERTURE STOP represents an aperture stop.

Parameters defining the shapes of the several aspheres in the present working example are listed at TABLE 2. In the present working example, the parameters given at TABLE 2 define aspheres according to the formula:

$$Z = (y^2/r)/[1 + \{1-(1+K) \cdot y^2/r^2\}^{1/2}] + A \cdot h^4 + B \cdot y^6 + C \cdot y^8 + D \cdot y^{10} + E \cdot y^{12} + F \cdot y^{14},$$

where y is height measured perpendicular to the optical axis, z is distance along the optical axis from a plane tangent to the vertex of the asphere to a location on the asphere at height y (i.e., sag), r is radius of curvature of the vertex, K is the conic constant, and the coefficients A through F represent the corresponding-order aspheric coefficients. At TABLE 2, CURV=1/r.

As units for the radii of curvature and the various distances given in the present working example, values may for example be understood to be in millimeters. As representative refractive indices at the center wavelength 157.62 nm of the light source employed in the present working example, 1.5593067 may be used for calcium fluoride, and 1.65669 may be used for barium fluoride, but the present invention should not be interpreted as being limited hereto. For purposes of the present working example, dispersion dn/dλ, expressed as change in refractive index as a function of change in wavelength, may be taken to be $-2.606 \times 10^{-3}$ nm$^{-1}$ for calcium fluoride, and $-4.376 \times 10^{-3}$ nm$^{-1}$ for barium fluoride, but the present invention should not be interpreted as being limited hereto. As used herein, the sign of dispersion dn/dλ, expressed as change in refractive index as a function of change in wavelength, is taken to be positive when refractive index n increases with increasing wavelength λ, and is taken to be negative when refractive index n decreases with increasing wavelength λ.

TABLE 1

NA = 0.845
φ = 22.6
β = 1/4
d0 = 47.6439
WD = 9.5687

| Lens No. | Radius of Curvature Front Surface | Radius of Curvature Rear Surface | Distance Between Surfaces | Material |
|---|---|---|---|---|
| L101 | −2380.0509 | A(1) | 13.6278 | CaF$_2$ |
|  |  |  | 26.7024 |  |
| L102 | −110.0000 | 4921.0571 | 13.1129 | CaF$_2$ |
|  |  |  | 11.7166 |  |
| L103 | A(2) | −180.1654 | 60.0000 | CaF$_2$ |
|  |  |  | 1.0000 |  |
| L104 | 2763.8810 | −305.5742 | 40.2373 | CaF$_2$ |
|  |  |  | 1.0000 |  |
| L105 | 365.9755 | −5893.0378 | 50.0000 | CaF$_2$ |
|  |  |  | 10.0000 |  |
| L106 | 260.0000 | 634.6682 | 36.2143 | CaF$_2$ |
|  |  |  | 59.6148 |  |
| L107 | 230.7010 | 962.5981 | 37.3370 | CaF$_2$ |
|  |  |  | 1.0000 |  |
| L108 | A(3) | 1417.9856 | 41.7394 | CaF$_2$ |
|  |  |  | 1.9957 |  |
| L109 | 1636.2819 | 104.2342 | 40.4438 | BaF$_2$ |
|  |  |  | 34.3630 |  |
| L110 | A(4) | 283.6735 | 13.0000 | BaF$_2$ |
|  |  |  | 95.9901 |  |
| L111 | −115.5481 | −5134.1160 | 42.0000 | BaF$_2$ |
|  |  |  | 1.0000 |  |
| L112 | 2326.7317 | −135.1195 | 50.0000 | CaF$_2$ |
|  |  |  | 1.0000 |  |
| L113 | −148.1207 | A(5) | 18.0000 | BaF$_2$ |
|  |  |  | 1.0000 |  |
| L114 | 486.1650 | −290.6419 | 48.9796 | CaF$_2$ |
|  |  |  | 1.0000 |  |
| L115 | A(6) | −340.4681 | 25.8916 | CaF$_2$ |
|  |  |  | 4.2050 |  |
| L116 | 623.2663 | −625.1668 | 38.9621 | CaF$_2$ |
|  |  |  | 6.6653 |  |
|  |  |  | APERTURE STOP |  |
|  |  |  | 37.7977 |  |
| L117 | 632.1950 | −336.2637 | 50.8672 | CaF$_2$ |
|  |  |  | 13.0123 |  |
| L118 | −240.4745 | −411.3026 | 28.0000 | CaF$_2$ |
|  |  |  | 1.0000 |  |
| L119 | 2382.1181 | −569.5006 | 45.7518 | CaF$_2$ |
|  |  |  | 1.0000 |  |
| L120 | 491.6154 | INFINITY | 30.2350 | CaF$_2$ |
|  |  |  | 1.0000 |  |
| L121 | 141.6068 | A(7) | 40.8667 | CaF$_2$ |
|  |  |  | 1.0000 |  |
| L122 | 204.7140 | 736.2331 | 35.0066 | CaF$_2$ |
|  |  |  | 3.9920 |  |
| L123 | 105724.5915 | 5041.4655 | 49.2429 | CaF$_2$ |

TABLE 2

| Surface No. | CURV C | K D | A E | B F |
|---|---|---|---|---|
| A(1) | 0.00582249 | 0.000000 | −2.25213E−07 | 8.54919E−12 |
|  | −3.82324E−16 | −3.15101E−20 | 1.60874E−23 | −1.69016E−27 |
| A(2) | −0.00366745 | 0.000000 | 2.68956E−08 | −3.37112E−13 |
|  | 1.78167E−17 | −4.58342E−22 | 3.21583E−25 | 9.53761E−30 |
| A(3) | 0.00654852 | 0.000000 | −2.51687E−08 | −1.08919E−12 |
|  | −5.61817E−17 | −2.72147E−21 | −5.27629E−26 | −8.03358E−30 |
| A(4) | −0.00588534 | 0.000000 | 3.89418E−08 | 5.78717E−12 |
|  | 2.26212E−18 | 1.31053E−20 | −2.44777E−24 | 3.24750E−28 |
| A(5) | 0.00076603 | 0.000000 | 3.00381E−08 | −1.09620E−13 |
|  | −1.75786E−17 | 5.50364E−22 | −2.07928E−27 | 1.60157E−31 |

TABLE 2-continued

| Surface No. | CURV C | K D | A E | B F |
|---|---|---|---|---|
| A(6) | −0.00052122 | 0.000000 | −2.43407E-08 | 5.96396E-14 |
|  | −8.33925E-18 | 1.08673E-22 | −7.98530E-27 | 2.37943E-31 |
| A(7) | 0.00268652 | 0.000000 | −4.48251E-08 | 2.92295E-12 |
|  | −5.41906E-17 | −6.50095E-21 | 6.54955E-25 | −2.00191E-29 |

Exemplary values satisfying various of the several conditions associated with the present invention are listed below for the present working example, but the present invention should not be interpreted as being limited thereby.

$$\frac{MX_2}{MX_1} = 214/272 = 0.787$$

| | |
|---|---|
| $\|FN_i\|=\|-171/185\|=0.924$ | (Lens L109) |
| $\|FN_i\|=\|-160/126\|=1.270$ | (Lens L110) |
| $\|FN_i\|=\|-181/170\|=1.065$ | (Lens L111) |
| $\|FN_i\|=\|-202/214\|=0.944$ | (Lens L113) |

Figure 4:
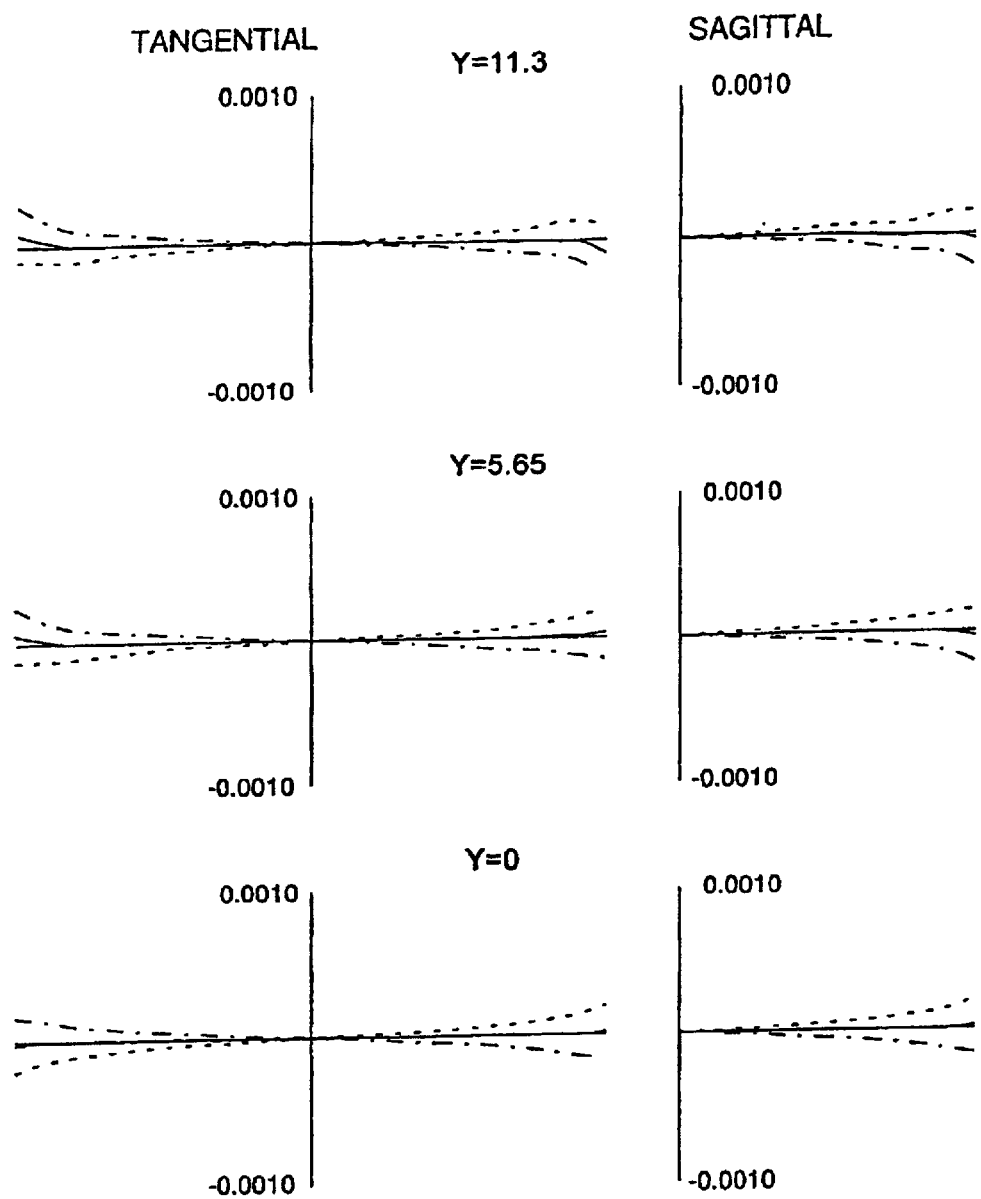
FIG. 4 shows aberration curves for the projection optical system of Working Example 1.

FIG. 4 presents aberration curves showing transverse aberration (coma) in the tangential and sagittal directions for the projection optical system PL of Working Example 1. At the aberration curves in FIG. 4, Y indicates image height, with aberration curves being presented for the three image heights represented by Y=0, Y=5.65, and maximum image height Y=11.3. At the aberration curves in FIG. 4, the solid line indicates aberration at the center wavelength 157.62 nm supplied by the light source in the present working example, the dashed line indicates aberration at a wavelength +0.25 pm relative to the center wavelength, and the alternating long and short dashed line indicates aberration at a wavelength −0.25 pm relative to the center wavelength. Based on the aberration curves presented here, it is clear that the projection optical system of the present working example permits satisfactory correction of aberration for image heights from zero to the maximum image height, and moreover, having investigated aberration out to a range which is twice the FWHM of 0.25 pm employed in the present working example, it is clear that satisfactory correction of chromatic aberration is permitted over the wavelength range represented by such FWHM linewidth.

As a result of efficient placement of small-effective-aperture lenses comprising barium fluoride, the present working example therefore permits attainment of satisfactory correction of chromatic aberration while at the same time permitting control of manufacturing cost through reduced use of barium fluoride. Furthermore, incorporating a projection optical system such as that of the present working example in an exposure apparatus makes it possible to satisfactorily transfer an image of an extremely detailed pattern onto a wafer or other such substrate. Since the projection optical system in the present working example has a circular image field of diameter 22.6, this is sufficient for, say, a rectangular exposure region within that image field that has a height of, say, approximately 5 in the along-scan direction, and that has a width of, say, approximately 22 in the cross-scan direction. Optical dimensions presented herein are in general scaleable, but if the radii of curvature and distances at TABLES 1 and 2 are, for the sake of illustration, representatively understood to be in units of millimeters, then the image height and image field dimensions given here will likewise be in units of millimeters. But it should be understood that the optical design principles of the present invention and the beneficial effects produced thereby are not in general limited to any particular choice of unit, nor should the present invention be interpreted as being limited to any such unit which is presented herein only for representative, descriptive, or exemplary purposes.

WORKING EXAMPLE 2

FIG. 2 shows the optical path in a projection optical system PL in a second working example of an embodiment associated with one aspect of the present invention. Referring to FIG. 2, the projection optical system PL of the present working example may be designed to provide satisfactory correction of chromatic aberration within a range suitable, for example, for use with an $F_2$ laser light source supplying light having a linewidth of, for example, 0.2 pm as measured on a FWHM basis about a center wavelength of 157.62 nm. In the present example, the projection optical system PL comprises 25 lenses L201, L202, . . . , L225, each of which respectively comprises a fluoride substance. As is indicated in the drawing, the height of a ray traveling along the optical path between the object plane and the image plane is markedly reduced in the vicinity of the more or less central region intermediate therebetween, permitting reduction in the effective aperture of the lenses in this region, and exploiting this fact, the present working example employs, for example, barium fluoride ($BaF_2$) in, for example, five negative lenses L211, L212, L213, L214, L216 arranged in this general region. Furthermore, in the present working example, calcium fluoride ($CaF_2$) is employed in a positive lens L215 interposed between two of those five negative lenses, and is also employed in all of the other lenses in the projection optical system PL.

Design values pertaining to the projection optical system PL of Working Example 2 are presented in TABLE 3. Numbering of lenses as listed under "Lens No." at TABLE 3 follows the same convention as used for the lenses L201, L202, . . . , L225 shown in FIG. 2. Parameters defining the shapes of the several aspheres in the present working example are listed at TABLE 4. Definitions and conventions applicable to the various symbols, abbreviations, parameters, and so forth listed at TABLES 3 and 4 are as described above with reference to Working Example 1. As units for the radii of curvature and the various distances given in the present working example, values may for example be understood to be in millimeters.

TABLE 3

NA = 0.845
φ = 22.6
β = 1/4
d0 = 48.2872
WD = 10.2240

| | Radius of Curvature | | Distance | |
|---|---|---|---|---|
| Lens No. | Front Surface | Rear Surface | Between Surfaces | Material |
| L201 | 657.3524 | −224.0596 | 23.8362 | $CaF_2$ |
|  |  |  | 1.0015 |  |
| L202 | 234.4929 | A(1) | 16.9691 | $CaF_2$ |
|  |  |  | 5.1384 |  |
| L203 | 983.1117 | 188.1002 | 15.1248 | $CaF_2$ |
|  |  |  | 16.6472 |  |

TABLE 3-continued

NA = 0.845
φ = 22.6
β = 1/4
d0 = 48.2872
WD = 10.2240

| Lens No. | Radius of Curvature | | Distance Between Surfaces | Material |
|---|---|---|---|---|
| | Front Surface | Rear Surface | | |
| L204 | −222.6517 | A(2) | 15.0000 | CaF$_2$ |
| | | | 35.2367 | |
| L205 | −101.9787 | −200.0698 | 18.8602 | CaF$_2$ |
| | | | 1.3585 | |
| L206 | −200.0000 | −182.7643 | 35.6248 | CaF$_2$ |
| | | | 0.8522 | |
| L207 | −20993.7187 | −197.8931 | 52.8709 | CaF$_2$ |
| | | | 4.6781 | |
| L208 | 371.5257 | −856.4055 | 52.3778 | CaF$_2$ |
| | | | 2.2677 | |
| L209 | 260.0000 | −24434.3105 | 47.0873 | CaF$_2$ |
| L210 | 142.5276 | 820.9520 | 52.7398 | CaF$_2$ |
| | | | 4.4585 | |
| L211 | 1963.2560 | 156.7628 | 15.0914 | BaF$_2$ |
| | | | 22.1711 | |
| L212 | A(3) | 102.2461 | 24.9355 | BaF$_2$ |
| | | | 36.6848 | |
| L213 | −136.6655 | 701.6293 | 44.0306 | BaF$_2$ |
| | | | 21.1006 | |
| L214 | −248.2828 | A(4) | 24.2178 | BaF$_2$ |
| | | | 1.1184 | |
| L215 | 877.4376 | −128.5042 | 56.6143 | CaF$_2$ |
| | | | 2.2257 | |
| L216 | −142.4514 | A(5) | 15.3692 | BaF$_2$ |
| | | | 8.5287 | |
| L217 | 1531.1511 | −323.8663 | 37.2959 | CaF$_2$ |
| | | | 1.0000 | |
| L218 | 650.2450 | −294.6130 | 57.2798 | CaF$_2$ |
| | | | 5.4385 | |
| | | | APERTURE STOP | |
| | | | 13.0000 | |
| L219 | 830.6787 | −293.4513 | 55.5622 | CaF$_2$ |
| | | | 5.3586 | |
| L220 | −261.8784 | −559.8408 | 25.4887 | CaF$_2$ |
| | | | 24.3154 | |
| L221 | 428.7719 | 3466.1346 | 40.0000 | CaF$_2$ |
| | | | 0.8496 | |
| L222 | 319.6772 | 2065.0720 | 40.0000 | CaF$_2$ |
| | | | 1.5857 | |
| L223 | 210.5081 | A(6) | 28.0301 | CaF$_2$ |
| | | | 13.6556 | |
| L224 | 126.5438 | 802.7599 | 42.5905 | CaF$_2$ |
| | | | 3.8617 | |
| L225 | INFINITY | INFINITY | 60.0000 | CaF$_2$ |

TABLE 4

| Surface No. | CURV C | K D | A E | B F |
|---|---|---|---|---|
| A(1) | 0.00200000 | 0.000000 | −8.79898E−08 | 3.59244E−12 |
| | 5.91607E−17 | 3.16405E−20 | −7.36952E−24 | 8.11124E−28 |
| A(2) | 0.00688622 | 0.000000 | −8.95806E−08 | −2.30112E−12 |
| | 1.54804E−16 | −4.19179E−20 | 3.12122E−24 | −9.01202E−29 |
| A(3) | 0.00075022 | 0.000000 | −2.62649E−08 | 4.38764E−12 |
| | −1.04523E−16 | −2.45661E−20 | 2.52084E−24 | −1.05467E−28 |
| A(4) | −0.00140493 | 0.000000 | 3.27267E−08 | 2.85388E−12 |
| | −1.28836E−17 | −5.92171E−21 | −4.93099E−25 | 2.53467E−29 |
| A(5) | 0.00125642 | 0.000000 | 3.76371E−08 | −1.21844E−12 |
| | 4.74856E−18 | 1.36631E−21 | −6.65549E−26 | 1.27013E−30 |
| A(6) | 0.00285442 | 0.000000 | −2.65725E−08 | 8.98623E−13 |
| | 7.45799E−18 | −1.10623E−21 | 4.73185E−26 | −2.48824E−31 |

Exemplary values satisfying various of the several conditions associated with the present invention are listed below for the present working example, but the present invention should not be interpreted as being limited thereby.

$$\frac{MX_2}{MX_1} = 218.6/272.4 = 0.802$$

| | |
|---|---|
| $\|FN_i\|=\|-260/192\|=1.354$ | (Lens L211) |
| $\|FN_i\|=\|-170/152\|=1.118$ | (Lens L212) |
| $\|FN_i\|=\|-171/142\|=1.204$ | (Lens L213) |
| $\|FN_i\|=\|-593/168\|=3.530$ | (Lens L214) |
| $\|FN_i\|=\|-183/219\|=0.836$ | (Lens L216) |

Figure 5:
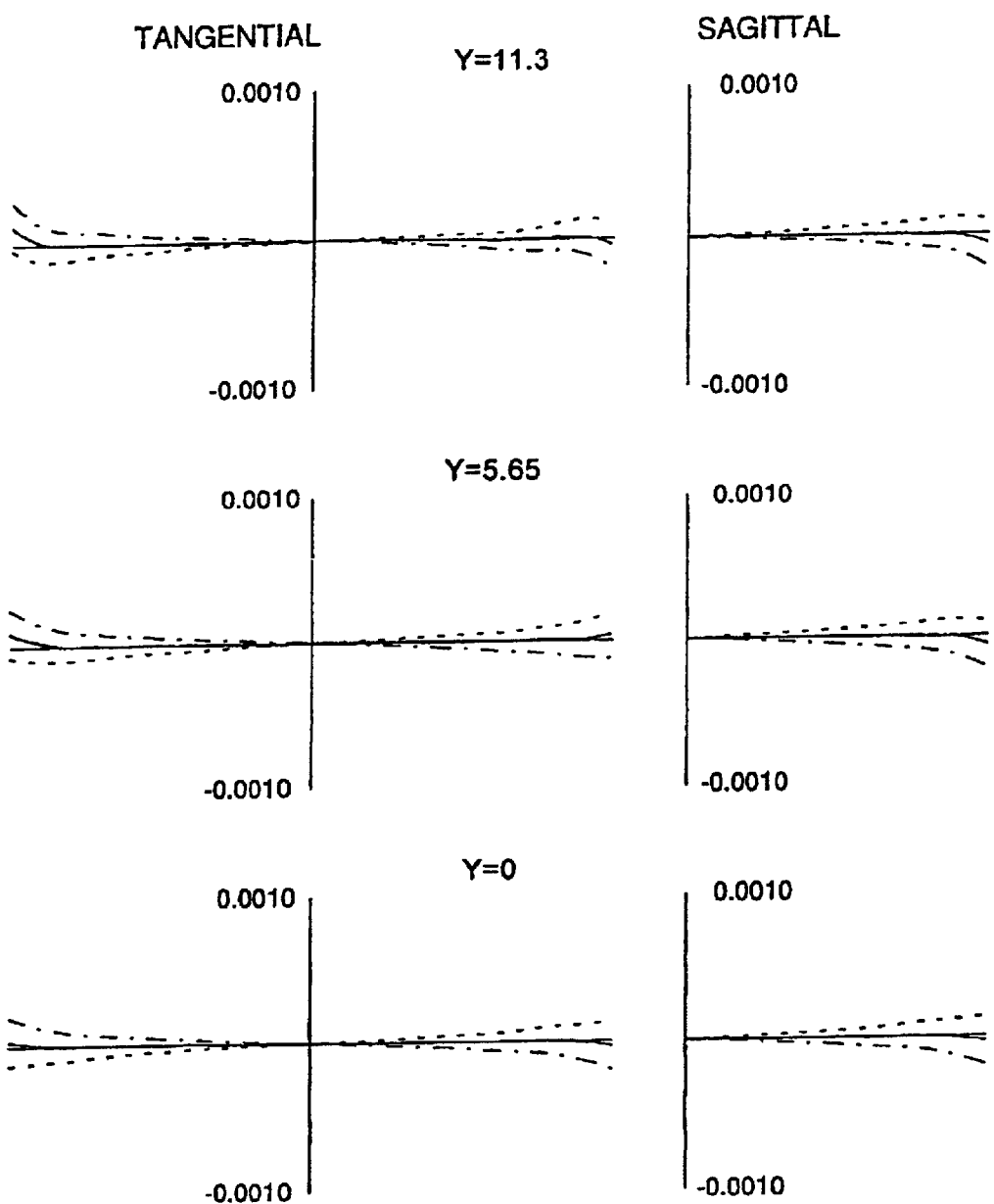
FIG. 5 shows aberration curves for the projection optical system of Working Example 2.

FIG. 5 presents aberration curves showing transverse aberration (coma) in the tangential and sagittal directions for the projection optical system PL of Working Example 2. At the aberration curves in FIG. 5, Y indicates image height, with aberration curves being presented for the three image heights represented by Y=0, Y=5.65, and maximum image height Y=11.3. At the aberration curves in FIG. 5, the solid line indicates aberration at the center wavelength 157.62 nm supplied by the light source in the present working example, the dashed line indicates aberration at a wavelength +0.2 pm relative to the center wavelength, and the alternating long and short dashed line indicates aberration at a wavelength −0.2 pm relative to the center wavelength. Based on the aberration curves presented here, it is clear that the projection optical system of the present working example permits satisfactory correction of aberration for image heights from zero to the maximum image height, and moreover, having investigated aberration out to a range which is twice the FWHM of 0.2 pm employed in the present working example, it is clear that satisfactory correction of chromatic aberration is permitted over the wavelength range represented by such FWHM linewidth.

As a result of efficient placement of small-effective-aperture lenses comprising barium fluoride, the present working example therefore permits attainment of satisfactory correction of chromatic aberration while at the same time permitting control of manufacturing cost through reduced use of barium fluoride. Furthermore, incorporating a projection optical system such as that of the present working example in an exposure apparatus makes it possible to satisfactorily transfer an image of an extremely detailed pattern onto a wafer or other such substrate. Since the projection optical system in the present working example has a circular image field of diameter 22.6, this is sufficient for, say, a rectangular exposure region within that image field that has a height of, say, approximately 5 in the along-scan direction, and that has a width of, say, approximately 22 in the cross-scan direction. Optical dimensions presented herein are in general scaleable, but if the radii of curvature and distances at TABLES 3 and 4 are, for the sake of illustration, representatively understood to be in units of millimeters, then the image height and image field dimensions given here will likewise be in units of millimeters. But it should be understood that the optical design principles of the present invention and the beneficial effects produced thereby are not in general limited to any particular choice of unit, nor should the present invention be interpreted as being limited to any such unit which is presented herein only for representative, descriptive, or exemplary purposes.

WORKING EXAMPLE 3

FIG. 3 shows the optical path in a projection optical system PL in a third working example of an embodiment associated with one aspect of the present invention. Referring to FIG. 3, the projection optical system PL of the present working example may be designed to provide satisfactory correction of chromatic aberration within a range suitable, for example, for use with an $F_2$ laser light source supplying light having a linewidth of, for example, 0.25 pm as measured on a FWHM basis about a center wavelength of 157.62 nm. In the present example, the projection optical system PL comprises 26 lenses L301, L302, ..., L326, each of which respectively comprises a fluoride substance. As is indicated in the drawing, the height of a ray traveling along the optical path between the object plane and the image plane is markedly reduced in the vicinity of the more or less central region intermediate therebetween, permitting reduction in the effective aperture of the lenses in this region, and exploiting this fact, the present working example employs, for example, barium fluoride ($BaF_2$) in, for example, five negative lenses L311, L312, L313, L315, L317 arranged in this general region. Furthermore, in the present working example, calcium fluoride ($CaF_2$) is employed in positive lenses L314, L316, each of which is respectively interposed between two of those five negative lenses, and is also employed in all of the other lenses in the projection optical system PL.

Design values pertaining to the projection optical system PL of Working Example 3 are presented in TABLE 5. Numbering of lenses as listed under "Lens No." at TABLE 5 follows the same convention as used for the lenses L301, L302, ..., L326 shown in FIG. 3. Parameters defining the shapes of the several aspheres in the present working example are listed at TABLE 6. Definitions and conventions applicable to the various symbols, abbreviations, parameters, and so forth listed at TABLES 5 and 6 are as described above with reference to Working Example 1. As units for the radii of curvature and the various distances given in the present working example, values may for example be understood to be in millimeters.

TABLE 5

NA = 0.845
ϕ = 22.6
β = 1/5
d0 = 50.2925
WD = 10.2171

| Lens No. | Radius of Curvature Front Surface | Radius of Curvature Rear Surface | Distance Between Surfaces | Material |
|---|---|---|---|---|
| L301 | 357.2634 | −297.0401 | 26.1490 | $CaF_2$ |
|  |  |  | 1.0000 |  |
| L302 | 170.9503 | A(1) | 36.7291 | $CaF_2$ |
|  |  |  | 16.5962 |  |
| L303 | −5984.0982 | 188.4076 | 15.0578 | $CaF_2$ |
|  |  |  | 17.0132 |  |
| L304 | −252.9808 | A(2) | 15.0000 | $CaF_2$ |
|  |  |  | 30.0542 |  |
| L305 | −101.9787 | 2235.5421 | 15.0008 | $CaF_2$ |
|  |  |  | 7.2133 |  |
| L306 | −888.0078 | −147.4825 | 43.9491 | $CaF_2$ |
|  |  |  | 0.8522 |  |
| L307 | INFINITY | −393.4393 | 31.3308 | $CaF_2$ |
|  |  |  | 1.0000 |  |
| L308 | 511.4690 | −479.6698 | 56.8866 | $CaF_2$ |
|  |  |  | 2.1082 |  |
| L309 | 260.0000 | −7410.4184 | 52.3298 | $CaF_2$ |
|  |  |  | 1.0290 |  |
| L310 | 211.4801 | 1920.5993 | 45.7949 | $CaF_2$ |
|  |  |  | 38.5835 |  |

TABLE 5-continued

NA = 0.845
ϕ = 22.6
β = 1/5
d0 = 50.2925
WD = 10.2171

| Lens No. | Radius of Curvature Front Surface | Radius of Curvature Rear Surface | Distance Between Surfaces | Material |
|---|---|---|---|---|
| L311 | −577.1751 | 269.2934 | 15.6991 | $BaF_2$ |
|  |  |  | 48.1373 |  |
| L312 | A(3) | 113.0584 | 15.6970 | $BaF_2$ |
|  |  |  | 36.9886 |  |
| L313 | −127.5609 | 1066.9193 | 38.2620 | $BaF_2$ |
|  |  |  | 1.0000 |  |
| L314 | 471.2885 | −141.8041 | 50.4185 | $CaF_2$ |
|  |  |  | 1.3036 |  |
| L315 | −178.9088 | A(4) | 15.0000 | $BaF_2$ |
|  |  |  | 1.6457 |  |
| L316 | 351.0282 | −193.2869 | 56.7679 | $CaF_2$ |
|  |  |  | 1.0000 |  |
| L317 | −206.3651 | A(5) | 15.0000 | $BaF_2$ |
|  |  |  | 7.1378 |  |
| L318 | 3325.8738 | −322.1797 | 38.0140 | $CaF_2$ |
|  |  |  | 1.0000 |  |
| L319 | 504.0637 | −423.6964 | 55.6561 | $CaF_2$ |
|  |  |  | 14.0032 |  |
|  |  |  | APERTURE STOP |  |
|  |  |  | 14.7678 |  |
| L320 | 395.1400 | −365.3907 | 66.9711 | $CaF_2$ |
|  |  |  | 5.7650 |  |
| L321 | −315.6666 | −875.1589 | 25.4887 | $CaF_2$ |
|  |  |  | 7.9214 |  |
| L322 | 465.5962 | 934.4138 | 40.0000 | $CaF_2$ |
|  |  |  | 0.8496 |  |
| L323 | 448.1143 | 12656.8130 | 40.0000 | $CaF_2$ |
|  |  |  | 1.1935 |  |
| L324 | 176.8246 | A(6) | 30.8124 | $CaF_2$ |
|  |  |  | 26.2792 |  |
| L325 | 121.3966 | 982.8938 | 34.7595 | $CaF_2$ |
|  |  |  | 3.0966 |  |
| L326 | 39919.3642 | INFINITY | 55.7444 | $CaF_2$ |

TABLE 6

| Surface No. | CURV C | K D | A E | B F |
|---|---|---|---|---|
| A(1) | 0.00887571 | 0.000000 | −5.07110E−08 | −2.69841E−12 |
|  | −2.24825E−16 | 1.47901E−20 | −7.36141E−24 | 5.28193E−28 |
| A(2) | 0.00380595 | 0.000000 | −1.17125E−07 | 2.02206E−12 |
|  | −6.53846E−17 | −2.08968E−21 | 1.13000E−24 | −5.82303E−29 |
| A(3) | −0.00010672 | 0.000000 | −5.85730E−09 | 2.11397E−13 |
|  | 3.79243E−18 | 3.75671E−21 | −3.64391E−25 | 1.20656E−29 |
| A(4) | 0.00325980 | 0.000000 | −9.53171E−09 | −5.91081E−13 |
|  | 3.31023E−18 | −1.51389E−23 | −1.55302E−26 | 1.56823E−31 |
| A(5) | 0.00034626 | 0.000000 | 3.09397E−08 | 1.11371E−13 |
|  | −3.21560E−18 | −2.49671E−23 | 3.23333E−27 | −4.87033E−32 |
| A(6) | 0.00326706 | 0.000000 | −2.19448E−08 | 1.00259E−12 |
|  | 8.08155E−18 | −1.03227E−21 | 7.60326E−26 | −1.04190E−30 |

Exemplary values satisfying various of the several conditions associated with the present invention are listed below for the present working example, but the present invention should not be interpreted as being limited thereby.

$$\frac{MX_2}{MX_1} = 199.4/284.6 = 0.701$$

| | |
|---|---|
| $\lvert FN_i \rvert = \lvert -278/183 \rvert = 1.519$ | (Lens L311) |
| $\lvert FN_i \rvert = \lvert -170/139 \rvert = 1.223$ | (Lens L312) |
| $\lvert FN_i \rvert = \lvert -171/161 \rvert = 1.062$ | (Lens L313) |
| $\lvert FN_i \rvert = \lvert -170/199 \rvert = 0.854$ | (Lens L315) |
| $\lvert FN_i \rvert = \lvert -293/234 \rvert = 1.252$ | (Lens L317) |

Figure 6:
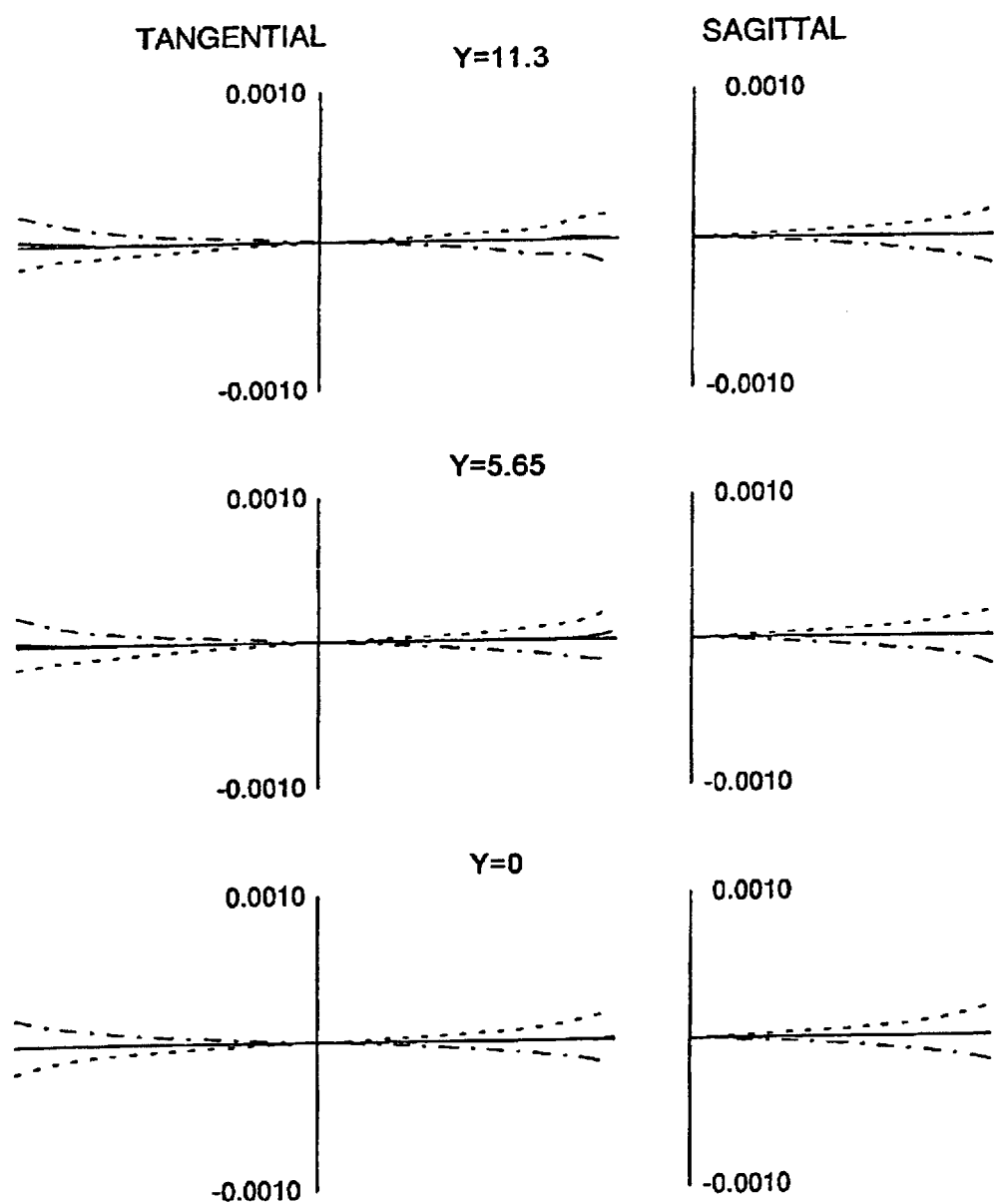
FIG. 6 shows aberration curves for the projection optical system of Working Example 3.

FIG. 6 presents aberration curves showing transverse aberration (coma) in the tangential and sagittal directions for the projection optical system PL of Working Example 3. At the aberration curves in FIG. 6, Y indicates image height, with aberration curves being presented for the three image heights represented by Y=0, Y=5.65, and maximum image height Y=11.3. At the aberration curves in FIG. 6, the solid line indicates aberration at the center wavelength 157.62 n=supplied by the light source in the present working example, the dashed line indicates aberration at a wavelength +0.25 pm relative to the center wavelength, and the alternating long and short dashed line indicates aberration at a wavelength −0.25 pm relative to the center wavelength. Based on the aberration curves presented here, it is clear that the projection optical system of the present working example permits satisfactory correction of aberration for image heights from zero to the maximum image height, and moreover, having investigated aberration out to a range which is twice the FWHM of 0.25 pm employed in the present working example, it is clear that satisfactory correction of chromatic aberration is permitted over the wavelength range represented by such FWHM linewidth.

As a result of efficient placement of small-effective-aperture lenses comprising barium fluoride, the present working example therefore permits attainment of satisfactory correction of chromatic aberration while at the same time permitting control of manufacturing cost through reduced use of barium fluoride. Furthermore, incorporating a projection optical system such as that of the present working example in an exposure apparatus makes it possible to satisfactorily transfer an image of an extremely detailed pattern onto a wafer or other such substrate. Since the projection optical system in the present working example has a circular image field of diameter 22.6, this is sufficient for, say, a rectangular exposure region within that image field that has a height of, say, approximately 5 in the along-scan direction, and that has a width of, say, approximately 22 in the cross-scan direction. Optical dimensions presented herein are in general scaleable, but if the radii of curvature and distances at TABLES 5 and 6 are, for the sake of illustration, representatively understood to be in units of millimeters, then the image height and image field dimensions given here will likewise be in units of millimeters. But it should be understood that the optical design principles of the present invention and the beneficial effects produced thereby are not in general limited to any particular choice of unit, nor should the present invention be interpreted as being limited to any such unit which is presented herein only for representative, descriptive, or exemplary purposes.

Figure 7:
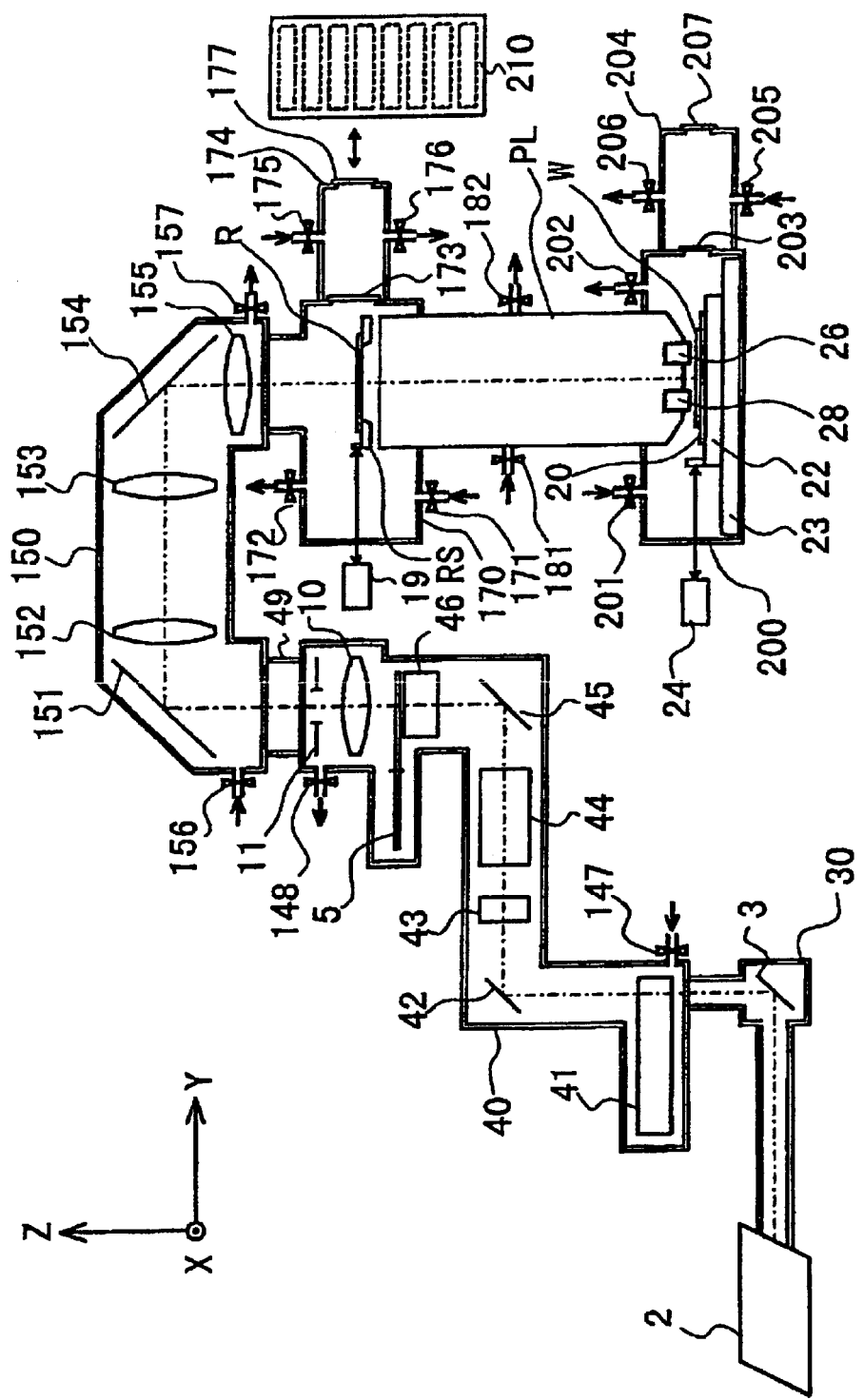
FIG. 7 shows a schematic representation of an exemplary layout of components in one embodiment of a projection exposure apparatus associated with the present invention.

A projection optical system PL such as has been described with reference to Working Examples 1 through 3 may be employed in a projection exposure apparatus such as that in the embodiment of the present invention shown in FIG. 7. Below, an exemplary embodiment of an exposure apparatus associated with the present invention is described with reference to FIG. 7. FIG. 7 shows a schematic representation of an exemplary layout of components in one embodiment of a projection exposure apparatus associated with the present invention. For purposes of description, an XYZ coordinate system is employed in FIG. 7 in which the Z axis is in a direction normal to the surface of a wafer W, the Y axis is in the plane of the wafer W surface and parallel to the plane of the paper at FIG. 7, and the X axis is in the plane of the wafer W surface and perpendicular to the plane of the paper at FIG. 7.

In the exposure apparatus of the present embodiment, the present invention is applied in the context of an apparatus employing, for example, an $F_2$ laser light source as actinic light source, and employing, for example, any one of the refractive projection optical systems described above with reference to Working Examples 1 through 3 as projection optical system PL. The exposure apparatus of the present embodiment employs, for example, step-and-scan exposure in which during each exposure "step" a reticle and a substrate are synchronously scanned while the reticle is irradiated by a zone of illumination of prescribed size and shape, with the reticle and the substrate then being advanced in a prescribed direction relative to the zone of illumination for another exposure "step," and with this then being repeated as many times as necessary to sequentially transfer an image of a pattern from the reticle to the substrate. An exposure apparatus employing such step-and-scan exposure is capable of transferring reticle pattern to substrate over a substrate area which is larger than the field of exposure of the projection optical system.

Referring to FIG. 7, a laser light source 2 comprises, for example, a fluorine dimer laser ($F_2$ laser) equipped with a linewidth narrowing module and an amplifier. Such an $F_2$ laser might without such a linewidth narrowing module be expected to output light having a natural linewidth of on the order of 0.6 pm to 1 pm as measured on a full-width-at-half-maximum (hereinafter "FWHM") basis. The linewidth narrowing module in the present embodiment may carry out linewidth narrowing through use of MOPA (Master Oscillator and Power Amplifier) technology, injection locking, or any other suitable method.

Figure 8:
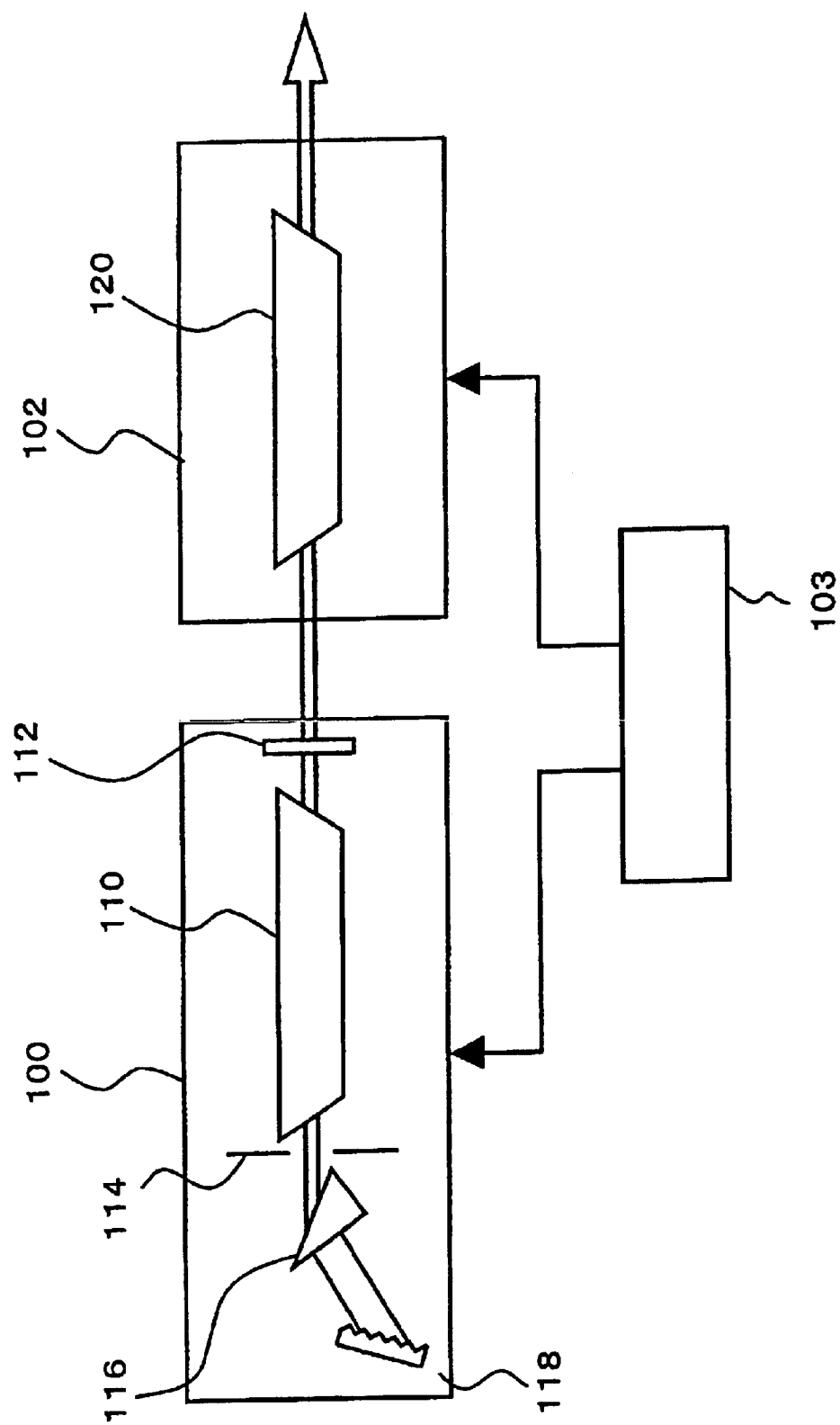
FIG. 8 shows a schematic representation of an exemplary layout of components in one embodiment of a laser light source associated with the present invention.

FIG. 8 shows a schematic representation of an exemplary layout of components in a laser light source employing MOPA technology which may be used as a light source in one or more embodiments associated with the present invention. Referring to FIG. 8, in the present embodiment, a laser light source 2 comprises a laser oscillator 100 capable of emitting laser light of narrowed linewidth, and an amplifier 102 coupled to the laser oscillator 100 and capable of amplifying laser light emitted from the laser oscillator 100. In the present embodiment, the laser oscillator 100 comprises a laser chamber 110, an output mirror 112 disposed at an output end of the laser chamber 110, an aperture 114, and a prism 116 and a diffraction grating 118 serving as wavelength selecting elements. Furthermore, the amplifier 102 comprises a laser chamber 120.

Laser light traveling within the laser oscillator 100 completes at least one round-trip loop along an optical path between the output mirror 112 and the diffraction grating 118, passing through the intervening aperture 114 on each leg of that loop, and thereafter exits the laser oscillator 100 with its linewidth having been narrowed to a FWHM value of on the order of, say, 0.2 to 0.3 pm. Laser light having such narrowed linewidth is incident on the laser chamber 120 of the amplifier 102, is amplified as it passes through that laser chamber 120, and thereafter exits the amplifier 102. At the laser light source 2 in the embodiment shown in FIG. 8, oscillation timing of the laser oscillator 100 and the amplifier 102 is controlled by means of an oscillation pulse timing controller 103. Furthermore, whereas the example shown in FIG. 8 employs a single amplifier unit, multiple amplifier units may be arranged in series and coupled to the output end of the laser oscillator 100.

Figure 9:
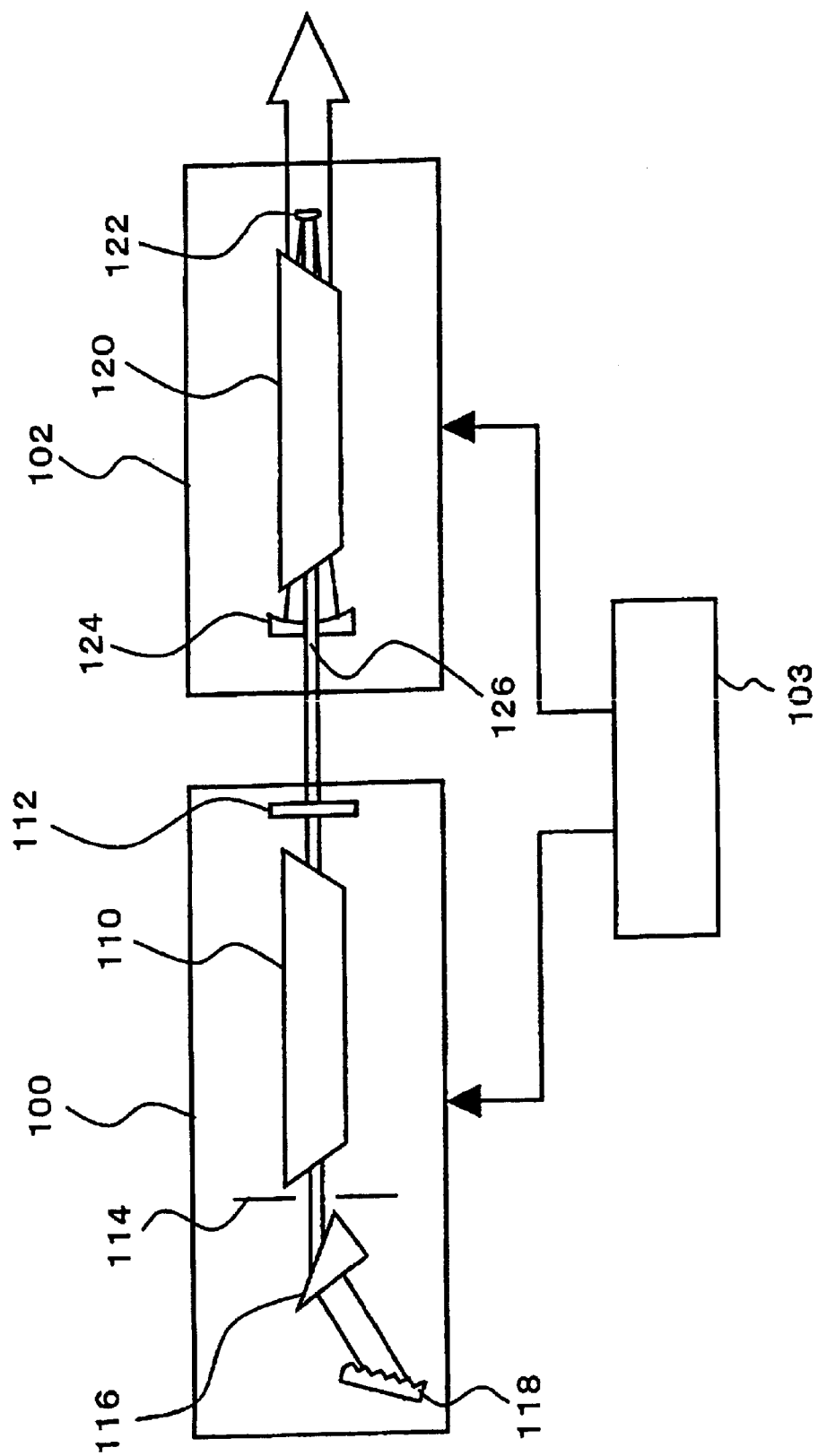
FIG. 9 shows a schematic representation of an exemplary layout of components in another embodiment of a laser light source associated with the present invention.

FIG. 9 shows a schematic representation of an exemplary layout of components in a laser light source 2 employing injection locking technology which may be used as a light source in one or more embodiments associated with the present invention. Referring to FIG. 9, a laser light source 2 comprises a laser oscillator 100 capable of emitting laser light of narrowed linewidth, and an amplifier 102 coupled to the laser oscillator 100 and capable of amplifying laser light emitted from the laser oscillator 100. In the present embodiment, the laser oscillator 100 comprises a laser chamber 110, an output mirror 112 disposed at an output end of the laser chamber 110, an aperture 114, and a prism 116 and a diffraction grating 118 serving as wavelength selecting elements. Furthermore, the amplifier 102 comprises a convex mirror 122, a laser chamber 120, and a concave mirror 124 wherein a coupling hole 126 is formed.

Laser light traveling within the laser oscillator 100 completes at least one round-trip loop along an optical path between the output mirror 112 and the diffraction grating 118, passing through the intervening aperture 114 on each leg of that loop, and thereafter exits the laser oscillator 100 with its linewidth having been narrowed to a FWHM value of on the order of, say, 0.2 to 0.3 pm. Laser light having such narrowed linewidth, in the present embodiment, enters the laser chamber 120 by way of the coupling hole 126 of the concave mirror 124, is amplified as it travels back and forth between the convex mirror 122 and the concave mirror 124, and exits the amplifier 102. At the laser light source 2 in the embodiment shown in FIG. 9, oscillation timing of the laser oscillator 100 and the amplifier 102 is controlled by means of an oscillation pulse timing controller 103. $F_2$ laser light sources employing such injection locking technology are disclosed, for example, at Japanese Patent Application Publication Kokai No. H13-24265 (2001), Japanese Patent Application Publication Kokai No. H12-357836 (2000), and elsewhere, but any other suitable device may be used.

Employment of such a light source, because it is capable of supplying actinic radiation having a narrowed linewidth, will facilitate high-resolution imaging of the reticle pattern. Furthermore, combination of the linewidth narrowing module with an amplifier as described above will facilitate output of light in useful quantities despite any reduction occurring due to narrowing of linewidth. Moreover, whereas the present embodiment has been described in terms of an apparatus employing an $F_2$ laser in the laser light source 2, any other suitable laser source emitting light more or less in the vacuum ultraviolet region of wavelength from on the order of approximately 120 nm to on the order of approximately 180 nm may be employed therein, including, for example, a krypton dimer laser ($Kr_2$ laser) emitting light of wavelength 146 nm, an argon dimer laser ($Ar_2$ laser) emitting light of wavelength 126 nm, and so forth.

Referring again to FIG. 7, pulsed laser light (illuminating light) from the laser light source 2 is deflected by a folding mirror 3 and is directed toward an optical path delay optical system 41, where it is divided into a plurality of temporally different light beams, the optical path lengths of which mutually differ by at least the amount of the temporal coherence length of the illuminating light from the laser light source 2. Such optical path delay optical systems are disclosed, for example, at Japanese Patent Application Publication Kokai No. H1-198759 (1989), Japanese Patent Application Publication Kokai No. H11-174365 (1999), and elsewhere, but any other such suitable device may be used.

Illuminating light exiting the optical path delay optical system 41 is deflected by a folding mirror 42; is thereafter incident, in order, on a first fly's eye lens 43, a zoom lens 44, and an oscillating mirror 45; and arrives at a second fly's eye lens 46. Arranged at the output side of the second fly's eye lens 46 is a rotating turret 5 permitting selection of an illumination optical system aperture stop to achieve an effective light source of desired size and shape. In the present example, the size of the light beam incident on the second fly's eye lens 46 from the zoom lens 44 may be varied so as to reduce optical losses at the illumination optical system aperture stop.

A light beam exiting an aperture of the illumination optical system aperture stop passes through a condenser lens group 10 and illuminates an illumination field stop (reticle blind) 11. An example of a construction that may be used for the illumination field stop 11 is disclosed at Japanese Patent Application Publication Kokai No. H4-196513 (1992) and at U.S. Pat. No. 5,473,410 which corresponds thereto, but any other such suitable device may be used.

Light from the illumination field stop 11 is guided to a reticle R by way of an illumination field stop imaging optical system (reticle blind imaging system) comprising folding mirrors 151, 154 and lens groups 152, 153, 155, and an illuminated region which is an image of the aperture portion of the illumination field stop 11 is formed at the reticle R. Light from the illuminated region on the reticle R is guided to a wafer W by way of a projection optical system PL, and a reduced image of a pattern within the illuminated region of the reticle R is formed at the wafer W. A reticle stage RS which retains the reticle R is capable of movement in two dimensions within the XY plane, coordinates corresponding to the position therein being measured by means of an interferometer 19 and positional control being carried out with respect thereto. Furthermore, a wafer stage 22 which retains the wafer W is likewise capable of movement in two dimensions within the XY plane, coordinates corresponding to the position therein being measured by means of an interferometer 24 and positional control being carried out with respect thereto. Such constitution permits the reticle R and the wafer W to be scanned in synchronous fashion with high precision.

Now, where the light employed for exposure (actinic radiation) has wavelength in the vacuum ultraviolet region, it will be necessary to remove from the optical path any oxygen, water vapor, hydrocarbon-type gas, or other such gas displaying strong absorption characteristics with respect to light in the applicable range of wavelengths (such gases will hereinafter be referred to collectively as "absorbing gas"). Accordingly, in the present embodiment, the illumination optical path (the optical path from the laser light source 2 to the reticle R) and the projection optical path (the optical path from the reticle R to the wafer W) are sealed off from the outside atmosphere, and the regions enclosing those optical paths are filled with a special gas displaying weak absorption characteristics with respect to light in the vacuum ultraviolet range, such as nitrogen, helium, argon, neon, krypton, or the like, or a mixture of any two or more of such gases (such gas or gas mixture will hereinafter be referred to collectively as "non-absorbing gas" or "special gas") Describing this in more specific terms, in the present embodiment, the optical path from the laser light source 2 to the optical path delay optical system 41 is surrounded by a casing 30 sealing it off from the outside atmosphere, the optical path from the optical path delay optical system 41 to the illumination field stop 11 is surrounded by a casing 40 sealing it off from the outside atmosphere, and the illumination field stop imaging optical system is surrounded by a casing 150 sealing it off from the outside atmosphere, and the interiors of these casings 30, 40, 150 are respectively filled with a special gas or gases as described above. In the present example, casing 40 and casing 150 are connected by a casing 49. Furthermore, the optical column of the projection optical system PL itself comprises a casing which encloses the optical path therein, and this casing is also filled with a special gas as described above.

Moreover, it is preferred in the present embodiment that the special gas with which each casing is filled be helium. However, the special gas filling the casings 30, 40, 150 enclosing the optical path of the illumination optical system from the laser light source 2 to the reticle R may also preferentially be nitrogen.

Furthermore, a casing 170 seals off from the outside atmosphere a space between the projection optical system PL and the casing 150 which encloses the illumination field stop imaging optical system, and the reticle stage RS which retains the reticle R is enclosed therein. Provided at this casing 170 is an access door 173 permitting loading and discharge of the reticle R, and provided at the exterior of this access door 173 is an airlock-type antechamber 174 for preventing contamination of the atmosphere at the interior of the casing 170 during loading and discharge of the reticle R. An access door 177 is likewise provided at this airlock-type antechamber 174, exchange of reticles with a reticle cassette 210 which stores a plurality of reticles taking place by way of this access door 177.

Furthermore, a casing 200 seals off from the outside atmosphere a space between the projection optical system PL and the wafer W, and enclosed therein are the wafer stage 22 which retains the wafer W, an oblique-incidence-type autofocus sensor 26 capable of detecting the position of the surface of the wafer W in the Z direction (i.e., focus position) and the tilt angle thereof, an off-axis-type alignment sensor 28, and a surface plate 23 on which the wafer stage 22 is mounted. Provided at this casing 200 is an access door 203 permitting loading and discharge of the wafer W, and provided at the exterior of this access door 203 is an airlock-type antechamber 204 for preventing contamination of the atmosphere at the interior of the casing 200. An access door 207 is likewise provided at this airlock-type antechamber 204, loading of the wafer W into the apparatus and discharge of the wafer W out from the apparatus taking place by way of this access door 207.

In the present example, casings 40, 150, 170, 200 are respectively equipped with inlet valves 147, 156, 171, 201, and these inlet valves 147, 156, 171, 201 are respectively connected by way of appropriate inlet plumbing, not shown, to one or more gas supply apparatuses, not shown. Furthermore, the casings 40, 150, 170, 200 are respectively equipped with exhaust valves 148, 157, 172, 202, and these exhaust valves 148, 157, 172, 202 are respectively connected by way of appropriate exhaust plumbing, not shown, to the gas supply apparatus or apparatuses. Furthermore, in the present embodiment, the temperature of the special gas or gases supplied by the gas supply apparatus or apparatuses is controlled by one or more temperature control apparatuses, not shown, so as to be a prescribed target temperature. If helium is used as special gas, it is preferred that the temperature control apparatus or apparatuses be disposed in the vicinity of the several casings.

In similar fashion, the airlock-type antechambers 174, 204 are likewise equipped with inlet valves 175, 205 and exhaust valves 176, 206, the inlet valves 175, 205 being respectively connected by way of appropriate inlet plumbing, not shown, and the exhaust valves 176, 206 being respectively connected by way of appropriate exhaust plumbing, not shown, to the same or different gas supply apparatus or apparatuses. Furthermore, the optical column of the projection optical system PL is likewise equipped with an inlet valve 181 and an exhaust valve182, the inlet valve 181 being connected by way of appropriate inlet plumbing, not shown, and the exhaust valve 182 being connected by way of appropriate exhaust plumbing, not shown, to the same or different gas supply apparatus or apparatuses.

Moreover, in the present embodiment, the inlet plumbing to which the inlet valves 147, 156, 171, 175, 181, 201, 205 are respectively connected, and the exhaust plumbing to which the exhaust valves 148, 157, 172, 176, 182, 202, 206 are respectively connected, is preferably equipped with one or more HEPA, ULPA, or like filters for particulate removal, and one or more chemical filters for removal of oxygen and other such absorbing gases.

Furthermore, it is preferred in the present embodiment that gas flushing be carried out at the airlock-type antechambers 174, 204 each time that a reticle or wafer is loaded or discharged. This may for example be carried out during loading of a reticle by opening access door 177, loading a reticle from the reticle cassette 210 into the airlock-type antechamber 174, closing access door 177, filling the interior of the airlock-type antechamber 174 with special gas, and thereafter opening access door 173 and mounting the reticle on the reticle stage RS. Similarly, this may for example be carried out during loading of a wafer by opening access door 207, loading a wafer into the airlock-type antechamber 204, closing access door 207, filling the interior of the airlock-type antechamber 204 with special gas, and thereafter opening the access door 203 and mounting the wafer on the wafer stage 22. Furthermore, the reverse operation may for example be carried out during reticle and wafer discharge. Furthermore, during gas flushing at either or both of the airlock-type antechambers 174, 204, the pressure of the atmosphere inside the airlock-type antechamber may be reduced prior to the opening of the inlet valve for supply of the special gas.

Because a significant amount of oxygen and/or other such absorbing gas is likely to be present within the gas used for gas flushing at the airlock-type antechambers 174, 204, and because it is likely that some fraction of such gas at the airlock-type antechambers 174, 204 would otherwise find its way into casings 170, 200, it is desirable to carry out gas flushing of casings 170, 200 at the same time that gas flushing is carried out at the airlock-type antechambers 174, 204. In addition, it is preferred in the present embodiment that the casings and the airlock-type antechambers be filled with special gas to a pressure greater than the pressure of the outside atmosphere.

Furthermore, though not shown at FIG. 7, in the present embodiment, adjustment means are provided such that at least one lens element among the plurality of lens elements making up the projection optical system PL may be retained in such fashion as to allow at least either its position or its orientation to be varied. Such a constitution will make it possible to vary the imaging characteristics of the projection optical system PL. Examples of constructions that may be used for such adjustment means are disclosed at Japanese Patent Application Publication Kokai No. H4-192317 (1992), Japanese Patent Application Publication Kokai No.

H4-127514 (1992) (and at U.S. Pat. No. 5,117,255 which corresponds thereto), Japanese Patent Application Publication Kokai No. H5-41344 (1993), and Japanese Patent Application Publication Kokai No. H6-84527 (1994) (and at U.S. Pat. No. 5,424,552 which corresponds thereto), but any other such suitable device may be used. It is furthermore preferred in the present embodiment that at least one lens element which is such that at least either its position or its orientation can be varied be a spherical lens.

Figure 10:
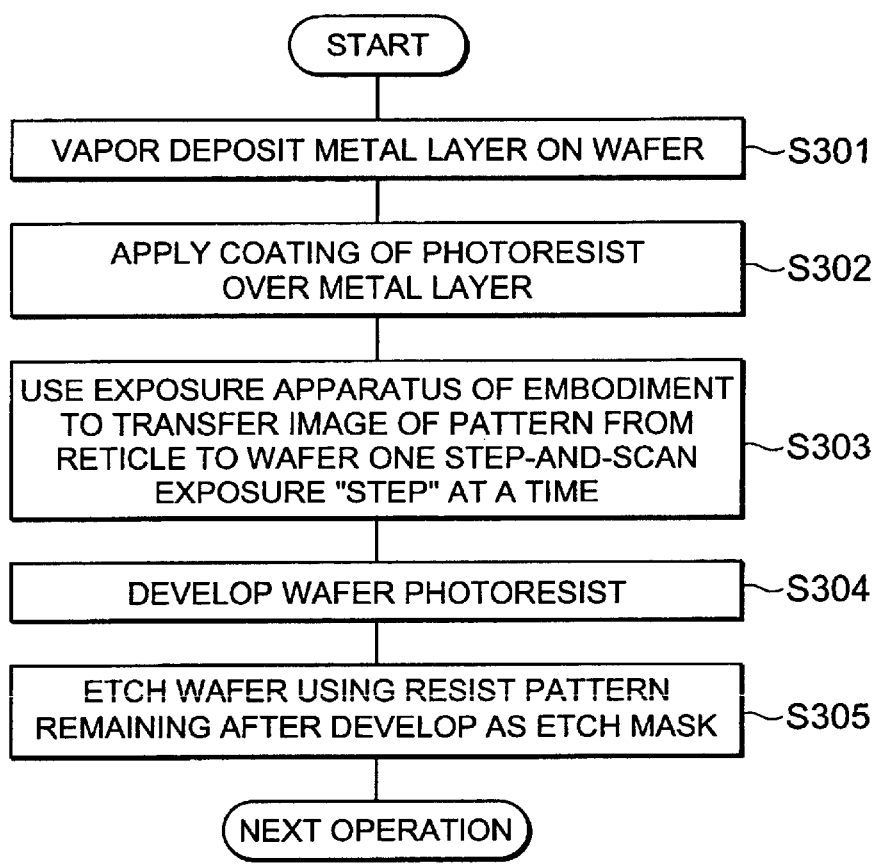
FIG. 10 is a flowchart showing an example of the operations that may be carried out in a microdevice manufacturing method associated with an embodiment of the present invention.

Referring to the flowchart in FIG. 10, an example of the operations that might be carried out when a projection exposure apparatus such as has been described with reference to one or more of the above embodiments is employed to form a prescribed circuit pattern on a wafer, permitting a microdevice comprising a semiconductor device to be obtained, will now be described. At step 301 in FIG. 10, a metal layer is first vapor deposited on, say, one lot of wafers. At step 302, photoresist is then applied over the metal layer on all of the wafers of that lot. At step 303, a projection exposure apparatus equipped with a projection optical system PL as described at any of Working Examples 1 through 3 is then used to transfer an image of a pattern from a reticle R to each wafer of that lot as result of sequential stepped exposure by way of that projection optical system PL.

At step 304 the photoresist on each wafer of that lot is developed, following which at step 305 each wafer of that lot is etched, the resist pattern remaining after develop serving as etch mask, as a result of which a circuit pattern corresponding to the pattern on the reticle R or some portion thereof is formed on each die of each wafer. By thereafter forming further layers of circuit patterns and so forth thereover in similar fashion, a semiconductor element or other such device can be manufactured. The semiconductor device manufacturing method described above makes it possible to obtain a semiconductor device having an extremely detailed circuit pattern and to do so with good throughput.

Figure 11:
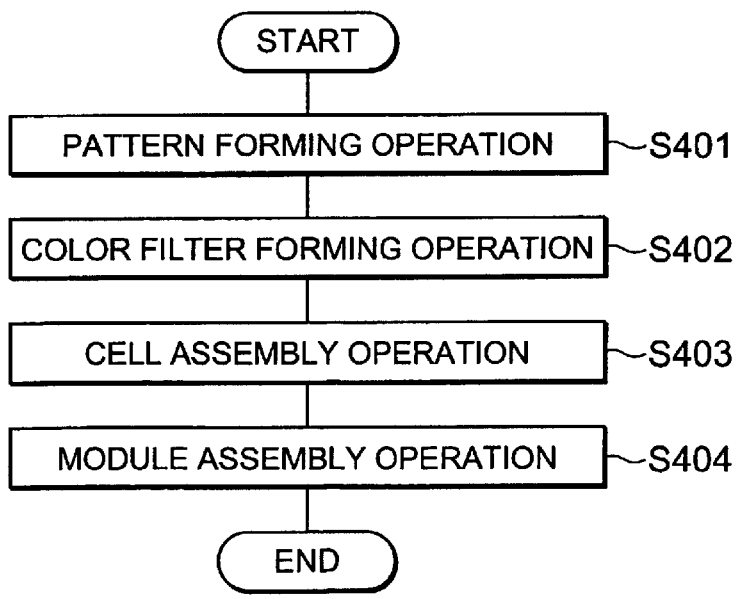
FIG. 11 is a flowchart showing an example of the operations that may be carried out in a microdevice manufacturing method associated with another embodiment of the present invention.

Moreover, by using a projection exposure apparatus such as has been described with reference to one or more of the above embodiments to form a prescribed circuit pattern on, say, a plate (e.g., a glass substrate), a microdevice comprising a liquid crystal display element may be obtained. Below, referring to the flowchart in FIG. 11, an example of the operations that might be carried out at such time will now be described At step 401 in FIG. 11, a pattern forming operation is carried out in a photolithographic procedure wherein a projection exposure apparatus such as has been described with reference to one or more of the above embodiments is employed to expose and transfer a pattern from a reticle R to a photosensitive substrate (e.g., a glass plate or the like coated with photoresist). As a result of such photolithographic procedure, a prescribed pattern comprising a multiplicity of electrodes and so forth is formed in a photoresist or like layer on the photosensitive substrate. By thereafter subjecting the exposed photosensitive layer on the substrate to a develop operation, an etch operation, a resist strip operation, and so forth, the prescribed pattern may be formed on the substrate itself, following which the color filter forming operation of step 402 is carried out.

At step 402, a color filter forming operation is carried out wherein a color filter on which a plurality of sets of three dots corresponding to the colors red (R), green (G), and blue (B) are arrayed in matrix fashion is formed. Following completion of the color filter forming operation of step 402, the cell assembly operation of step 403 is carried out.

At step 403, a cell assembly operation is carried out wherein a substrate having prescribed pattern as obtained at the pattern forming operation of step 401, a color filter as obtained at the color filter forming operation of step 402, and so forth are used to assemble a liquid crystal panel comprising one or more liquid crystal cells. At the cell assembly operation of step 403, a liquid crystal panel comprising one or more liquid crystal cells may be manufactured, for example, by injecting liquid crystal into the space or spaces between a substrate having prescribed pattern as obtained at the pattern forming operation of step 401 and a color filter as obtained at the color filter forming operation of step 402.

At step 404, a module assembly operation is thereafter carried out wherein various parts such as a backlight and electrical circuitry capable of causing display operation of the assembled liquid crystal panel comprising one or more liquid crystal cells are attached thereto, completing manufacture of the liquid crystal display element. The liquid crystal display element manufacturing method described above makes it possible to obtain a liquid crystal display element having an extremely detailed circuit pattern and to do so with good throughput.

Whereas the embodiments described with reference to FIG. 7 were described in terms of an apparatus employing fly's eye lenses 43, 46, each serving as optical integrator (a.k.a. "uniformizer," "homogenizer"), in the illumination optical system, one or more micro-fly's-eye-lenses wherein a plurality of lens surfaces have been formed on a single substrate through etching or like technique may alternatively or in addition be employed. Furthermore, instead of or in addition to the first fly's eye lens 43, a diffractive optical element may be employed that causes scattering of incident light by diffraction, forming a circular, annular, or multipolar field of illumination at a far-field (Fraunhofer diffraction) region with respect thereto. As such diffractive optical element, a device such as is disclosed, for example, at U.S. Pat. No. 5,850,300 or any other such suitable device may be used. Where such a diffractive optical element is employed, the optical path delay optical system 41 may be omitted.

Furthermore, an internal-reflection-type integrator (rod integrator, light pipe, light tunnel, etc.) may be employed as optical integrator. Where such an internal-reflection-type integrator is used, the output face of the internal-reflection-type integrator and the plane of the reticle pattern will preferably be more or less mutually conjugate. Accordingly, if such an internal-reflection-type integrator is for example applied to an embodiment described with reference to FIG. 7, the illumination field stop (reticle blind) 11 might for example be disposed proximate to the output face of the internal-reflection-type integrator, and the zoom lens 44 might for example be constructed such that the output face of the first fly's eye lens 43 and the input face of the internal-reflection-type integrator are more or less mutually conjugate.

Moreover, whereas the above embodiments were described in terms of an apparatus employing calcium fluoride ($CaF_2$; fluorite) and barium fluoride ($BaF_2$) in the lens components of the projection optical system, the present invention is not limited thereto, it being sufficient for the purposes of the present invention that the projection optical system comprise one or more refractive optical members collectively comprising at least two fluoride substances, preferably two species selected from among the group consisting of calcium fluoride ($CaF_2$; fluorite), barium fluoride ($BaF_2$), lithium fluoride (LiF), magnesium fluoride ($MgF_2$), strontium fluoride ($SrF_2$), lithium calcium aluminum fluoride ($LiCaAlF_6$), and lithium strontium aluminum fluoride ($LiSrAlF_6$). Note that where used in the present invention it is preferred that the lithium calcium aluminum fluoride and/or lithium strontium aluminum fluoride be of the class of compound fluorides referred to as LiCAF or LiSAF crystals without doping of trace amounts of chromium or selenium. Furthermore, one or more of the lens surfaces of the lens components making up the projection optical system PL described with reference to any of Working Examples 1 through 3 may be provided with an antireflecting coating. As such antireflecting coating, it is possible to employ, for example, a first coating comprising not more than three, and preferably between two and three, film layers, and having a high transmittance but only admitting light over a narrow range of angles of incidence; and/or, for example, a second coating comprising not less than four film layers and having a low transmittance but admitting light over a wide range of angles of incidence. Through sufficient control of moisture at the time such antireflective coating is applied to a lens surface, it is possible to achieve a transmittance of on the order of, say, 99.9% for the first layer, and a transmittance of, say, on the order of 99% for the second layer, within the wavelength domain applicable to an $F_2$ laser. Furthermore, in one or more embodiments of the present invention, through appropriate allocation of the first coating and the second coating at one or more of the lens surfaces of the lens components making up the projection optical system PL in correspondence to angles with which rays are incident thereat (e.g., allocating the first coating to one or more lens surfaces at which rays are incident over a narrow range of angles of incidence, and allocating the second coating to one or more lens surfaces at which rays are incident over a wide range of angles of incidence), it is possible to reduce angular nonuniformities among light beams arriving at various points in the image field of the projection optical system as well as nonuniformities in transmittance throughout the image field of the projection optical system, even for large numerical apertures and even for large image fields. Moreover, in one or more embodiments of the present invention, such allocation of antireflecting coatings may be carried out at the illumination optical system instead of or in addition to the projection optical system.

Furthermore, in one or more embodiments of the present invention described with reference to FIG. 7, a prism comprising birefringent material for speckle prevention may be arranged at the input side of the first fly's eye lens 43. Such a prism for prevention of speckle is disclosed, for example, at U.S. Pat. No. 5,253,110, or any other such suitable device may be used. Furthermore, where the wavelength of actinic light is not greater than about 180 nm, a prism comprising magnesium fluoride ($MgF_2$) crystal may be used in place of the quartz prism disclosed at U.S. Pat. No. 5,253,110, or any other such suitable device may be used.

Such a wedge prism comprising magnesium fluoride crystal is preferably arranged in a direction such as will cause it to intersect and present a range of thicknesses to the optical axis of the illumination optical system. In addition, an optical path correction wedge prism is preferably arranged so as to face such wedge prism comprising magnesium fluoride crystal such that the prism angles of the two prisms face in mutually opposite directions. Furthermore, such optical path correction wedge prism preferably has a prism angle equal to that of the wedge prism comprising magnesium fluoride crystal and preferably comprises an optically transmissive material which does not display birefringence. Such an arrangement will make it possible to achieve a configuration wherein light incident on the pair of prisms travels in the same direction as light exiting therefrom.

Furthermore, whereas the embodiments described with reference to FIG. 7 were described in terms of an apparatus employing step-and-scan exposure, the projection exposure apparatus of the present invention may alternatively or in addition employ stitching and/or slit scanning exposure. Where stitching and/or slit scanning exposure is employed, a reticle and a substrate are synchronously scanned in a prescribed first direction relative to a zone of illumination of prescribed shape and size on the reticle to expose a first strip-like region on the substrate. The reticle is thereafter changed or the reticle is thereafter moved a prescribed distance in a second direction perpendicular to the first direction at the zone of illumination, and the substrate is shifted in a direction conjugate to the second direction at the zone of illumination. Moreover, the reticle and the substrate are again synchronously scanned in a prescribed first direction relative to the zone of illumination of prescribed shape and size on the reticle to expose a second strip-like region on the substrate, and this sequence of operations may be repeated as necessary.

An exposure apparatus employing such stitching and/or slit scanning exposure is capable of transferring reticle pattern to substrate over a substrate area which is larger than the field of exposure of the projection optical system. Exposure apparatuses employing such stitching and/or slit scanning exposure are disclosed, for example, at U.S. Pat. No. 5,477,304, Japanese Patent Application Publication Kokai No. H8-330220 (1996), Japanese Patent Application Publication Kokai No. H10-284408 (1998), and elsewhere, but any other such suitable technique may be used. Moreover, one or more embodiments of the present invention may alternatively or in addition employ single-field exposure and/or step-and-repeat exposure in which an image of a pattern on a reticle is transferred substantially simultaneously (i.e., substantially without scanning) to substantially the entire area of a substrate or to a prescribed portion thereof corresponding to one step-and-repeat exposure "step."

Furthermore, whereas the embodiments described with reference to FIG. 7 were described in terms of an apparatus employing a single wafer stage for retaining a wafer or other such workpiece (e.g., photosensitive substrate), a construction may be adopted which employs two or more wafer stages, examples of such configurations being disclosed at Japanese Patent Application Publication Kokai No. H5-175098 (1993), Japanese Patent Application Publication Kokai No. H10-163097 (1998), Japanese Patent Application Publication Kokai No. H10-163098 (1998), Japanese Patent Application Publication Kokai No. H10-163099 (1998), Japanese Patent Application Publication Kokai No. H10-214783 (1998), and elsewhere, but any other such suitable configuration may be employed.

Furthermore, the present invention may be applied not only to exposure apparatuses used for manufacture of semiconductor devices, but also to exposure apparatuses capable of transferring a device pattern to a glass plate such as those used for manufacture of display devices comprising liquid crystal elements or the like, exposure apparatuses capable of transferring a device pattern to a ceramic wafer such as those used for manufacture of thin-film magnetic heads, exposure apparatuses used for manufacture of charge coupled devices and other such image pickup elements, and so forth. Moreover, the present invention may also be applied to exposure apparatuses capable of transferring a circuit pattern to a glass substrate, silicon wafer, or the like for manufacture of reticles or masks.

Whereas several preferred embodiments of the present invention and variations thereof have been described above, these examples have been presented merely for purposes of describing the invention and it not intended that the invention should be limited thereto. The present invention may be carried out in the context of a wide variety of modes and embodiments other than those specifically presented herein.

What is claimed is:

1. A projection optical system capable of projecting to an image space an image of an object in an object space, the system comprising:

a) at least one first refractive optical member comprising a first fluoride substance; and
   b) at least one second refractive optical member comprising a second fluoride substance;
   c) wherein $MX_1$ is greater than $MX_2$; and
   d) the design condition $$0.4 < \frac{MX_2}{MX_1} < 0.87$$

is satisfied;
   e) where $MX_1$ is the effective aperture of the surface or surfaces having the largest effective aperture among the surface or surfaces of the first refractive optical member or members; and
   f) $MX_2$ is the effective aperture of the surface or surfaces having the largest effective aperture among the surface or surfaces of the second refractive optical member or members.

2. A projection optical system according to claim 1 wherein:

a) the first fluoride substance is calcium fluoride; and
   b) the second fluoride substance is barium fluoride.

3. A projection optical system according to claim 2 furthermore comprising:

a) at least one positive lens component; and
   b) at least one negative lens component;
   c) wherein at least one of the positive lens component or components comprises the first fluoride substance; and
   d) at least one of the negative lens component or components comprises the second fluoride substance.

4. A projection optical system according to claim 3 wherein each of the lens components of the projection optical system respectively consists of only the first fluoride substance or the second fluoride substance or both.

5. A projection optical system according to claim 4 wherein the f-number of the second refractive optical member or the respective f-numbers of each of the second refractive optical members satisfies or satisfy the design condition $0.8 < |FN_i|$, where $FN_i$ represents each such f-number.

6. A projection optical system according to claim 1 furthermore comprising:

a) at least one positive lens component; and
   b) at least one negative lens component;
   c) wherein at least one of the positive lens component or components comprises the first fluoride substance; and
   d) at least one of the negative lens component or components comprises the second fluoride substance.

7. A projection optical system according to claim 1 wherein each of the lens components of the projection optical system respectively consists of only the first fluoride substance or the second fluoride substance or both.

8. A projection optical system according to claim 1 wherein the f-number of the second refractive optical member or the respective f-numbers of each of the second refractive optical members satisfies or satisfy the design condition $0.8 < |FN_i|$, where $FN_i$ represents each such f-number.

9. An exposure apparatus capable of transferring onto a substrate an image of a pattern on a mask, the apparatus comprising:

a) a light source capable of supplying radiation for exposure;
   b) an illumination optical system arranged to receive at least some of the radiation from the light source and guide at least some of the received radiation to the mask; and
   c) a projection optical system according to claim 1;
   d) wherein the mask is capable of being disposed in the object space; and
   e) the substrate is capable of being disposed in the image space.

10. A projection exposure method for transferring onto a substrate an image of a pattern on a mask, the method comprising:

a) readying the mask for exposure;
    b) readying the substrate for exposure; and
    c) using a projection exposure apparatus according to claim 9 to form on the substrate an image of the pattern on the mask.

11. An exposure apparatus transferring onto a substrate an image of a pattern on a mask, the apparatus comprising:

a light source having a natural linewidth;
    a linewidth narrowing unit in the light source receiving the radiation having the natural linewidth and emitting radiation for exposure having a linewidth narrower than the natural linewidth;
    an illumination optical system receiving the radiation from the light source and guiding the received radiation to the mask; and
    a projection optical system forming on the substrate an image of the pattern on the mask in correspondence to radiation received from the mask, the projection optical system comprising one or more refractive optical members collectively comprising at least two fluoride substances, wherein
    the at least two fluoride substances comprise a first fluoride substance and a second fluoride substance, and
    each f-number $FN_1$ of the one or more refractive optical members comprising the second flouride substance satisfies a design condition of $0.8 < |FN_i|$.

12. A projection exposure apparatus according to claim 11 wherein each of the refractive optical members within the projection optical system respectively comprises one or more fluoride substances.

13. A projection exposure apparatus according to claim 12 wherein the at least two fluoride substances collectively include calcium fluoride and barium fluoride.

14. A projection exposure apparatus according to claim 13 wherein:

a) the at least two fluoride substances collectively include a first fluoride substance and a second fluoride substance which are such that:

b) $MX_1$ is greater than $MX_2$; and c) the design condition $$0.4 < \frac{MX_2}{MX_1} < 0.87$$

is satisfied;

d) where $MX_1$ is the effective aperture of the surface or surfaces having the largest effective aperture among the surface or surfaces of the refractive optical member or members comprising the first fluoride substance; and e) $MX_2$ is the effective aperture of the surface or surfaces having the largest effective aperture among the surface or surfaces of the refractive optical member or members comprising the second fluoride substance.

15. A projection exposure apparatus according to claim 14 wherein the projection optical system furthermore comprises:

a) at least one positive lens component; and b) at least one negative lens component;

c) wherein at least one of the positive lens component or components comprises the first fluoride substance; and d) at least one of the negative lens component or components comprises the second fluoride substance.

16. A projection exposure apparatus according to claim 15 wherein the linewidth of the radiation from the light source is not more than half of the natural linewidth thereof as measured on a full-width-at-half-maximum basis.

17. A projection exposure apparatus according to claim 16 wherein the light source comprises an $F_2$ laser.

18. A projection exposure apparatus according to claim 17 wherein the light source comprises:

a) an oscillator capable of generating radiation having a linewidth narrower than a natural linewidth thereof; and b) an amplifier capable of amplifying the output of the radiation generated by the oscillator.

19. A projection exposure apparatus according to claim 18 wherein the linewidth of the radiation supplied by the light source is not more than 0.3 pm as measured on a full-width-at-half-maximum basis.

20. A projection exposure apparatus according to claim 19 wherein the at least two fluoride substances collectively include two species selected from among the group consisting of calcium fluoride, barium fluoride, lithium fluoride, magnesium fluoride, strontium fluoride, lithium calcium aluminum fluoride, and lithium strontium aluminum fluoride.

21. A projection exposure apparatus according to claim 11 wherein the at least two fluoride substances collectively include calcium fluoride and barium fluoride.

22. A projection exposure apparatus according to claim 11 wherein a linewidth of the radiation from the light source is not more than half of a natural linewidth thereof as measured on a full-width-at-half-maximum basis.

23. A projection exposure apparatus according to claim 11 wherein the light source comprises an $F_2$ laser.

24. A projection exposure apparatus according to claim 10 wherein the light source comprises:

a) an oscillator capable of generating radiation having a linewidth narrower than a natural linewidth thereof; and b) an amplifier capable of amplifying the output of the radiation generated by the oscillator.

25. A projection exposure apparatus according to claim 11 wherein a linewidth of the radiation supplied by the light source is not more than 0.3 pm as measured on a full-width-at-half-maximum basis.

26. A projection exposure apparatus according to claim 11 wherein the at least two fluoride substances include two species selected from among the group consisting of calcium fluoride, barium fluoride, lithium fluoride, magnesium fluoride, strontium fluoride, lithium calcium aluminum fluoride, and lithium strontium aluminum fluoride.

27. A projection exposure method for transferring onto a substrate an image of a pattern on a mask, the method comprising:

a) readying the mask for exposure;

b) readying the substrate for exposure; and c) using a projection exposure apparatus according to claim 10 to form on the substrate an image of the pattern on the mask.

28. An exposure apparatus transferring onto a substrate an image of a pattern on a mask, the apparatus comprising:

a light source having a natural linewidth;

a linewidth narrowing unit in the light source receiving the radiation having the natural linewidth and emitting radiation for exposure having a linewidth narrower than the natural linewidth;

an illumination optical system receiving at least some of the radiation from the light source and guiding at least some of the received radiation to the mask; and a projection optical system forming on the substrate an image of the pattern on the mask in correspondence to radiation received from the mask, wherein the projection optical system comprises one or more refractive optical members collectively comprising at least two fluoride substances, wherein the at least two fluoride substances collectively comprise a first fluoride substance and a second fluoride substance with $MX_1$ being greater than $MX_2$, a design condition $$0.4 < \frac{MX_2}{MX_1} < 0.87$$

is satisfied, $MX_1$ is the effective aperture of the surface or surfaces having the largest effective aperture among the surface or surfaces of the refractive optical member or members comprising the first fluoride substance, and $MX_2$ is the effective aperture of the surface or surfaces having the largest effective aperture among the surface or surfaces of the refractive optical member or members comprising the second fluoride substance.

29. An exposure apparatus transferring onto a substrate an image of a pattern on a mask, the apparatus comprising:

a light source having a natural linewidth;

a linewidth narrowing unit in the light source receiving the radiation having the natural linewidth and emitting radiation for exposure having a linewidth narrower than the natural linewidth;

an illumination optical system receiving at least some of the radiation from the light source and guiding at least some of the received radiation to the mask; and a projection optical system forming on the substrate an image of the pattern on the mask in correspondence to radiation received from the mask, wherein the projection optical system comprises one or more refractive optical members collectively comprising at least two fluoride substances, each of the refractive optical members within the projection optical system respectively comprises one or more fluoride substances, the at least two fluoride substances collectively include calcium fluoride and barium flouride, the at least two fluoride substances collectively include a first fluoride substance and a second fluoride substance $MX_1$ is the effective aperture of the surface or surfaces having the largest effective aperture among the surface or surfaces of the refractive optical member or members comprising the first fluoride substance, $MX_2$ is the effective aperture of the surface or surfaces having the largest effective aperture among the surface or surfaces of the refractive optical member or members comprising the second fluoride substance, $MX_1$ being greater than $MX_2$, and a design condition $$0.4 < \frac{MX_2}{MX_1} < 0.87$$

is satisfied.

30. A projection optical system according to claim 29 wherein the projection optical system further comprises:

at least one positive lens component; and at least one negative lens component; wherein at least one of the positive lens component or components comprises the first fluoride substance; and at least one of the negative lens component or components comprises the second fluoride substance.

31. A projection optical system according to claim 30 wherein:

the at least two fluoride substances collectively include a first substance and a second fluoride substance, and the f-number or the respective f-numbers of the refractive optical member or members comprising the second fluoride substance satisfies or satisfy the design condition $0.8 < |FN_i|$, where $FN_i$ represents each such f-number.

32. A projection exposure apparatus according to claim 31 wherein the linewidth of the radiation supplied from the light source is not more than half of the natural linewidth thereof as measured on a full-width-at-half-maximum basis.

33. A projection exposure apparatus according to claim 32 wherein the light source comprises an $F_2$ laser.

34. A projection exposure apparatus according to claim 33 wherein the light source comprises:

an oscillator generating radiation having a linewidth narrower than a natural linewidth thereof; and an amplifier capable of amplifying the output of the radiation generated by the oscillator.

35. A projection exposure apparatus according to claim 34 wherein the linewidth of the radiation supplied by the light source is not more than 0.3 pm as measured on a full-width-at-half-maximum basis.

36. A projection exposure apparatus according to claim 35 wherein the at least two fluoride substances collectively include two species selected from among the group consisting of calcium fluoride, barium fluoride, lithium fluoride, magnesium fluoride, strontium fluoride, lithium calcium aluminum fluoride, and lithium strontium aluminum fluoride.

* * * * *

UNITED STATES PATENT AND TRADEMARK OFFICE
CERTIFICATE OF CORRECTION

PATENT NO. : 6,714,280 B2
DATED : March 30, 2004
INVENTOR(S) : Yasuhiro Omura

It is certified that error appears in the above-identified patent and that said Letters Patent is hereby corrected as shown below:

Title page,
Item [56], References Cited, U.S. PATENT DOCUMENTS, add
-- 2001/0012099   8/2001   Kumagai
  2002/0005938   1/2002   Omura --.

Column 30,
Line 37, after "source" insert -- emitting radiation --.

Column 31,
Line 58, change "linewidth" to -- the linewidth --;
Line 59, change "a natural" to -- the natural --;
Line 63, change "claim 10" to -- claim 11 --.

Column 32,
Line 4, change "a linewidth" to -- the linewidth --;
Line 19, change "claim 10" to -- claim 11 --;
Lines 23 and 57, before "having" insert -- emitting radiation --;
Line 36, delete "wherein";

Column 33,
Line 10, after "substance" insert -- , --;
Line 11, before "$MX_1$" insert -- where --;
Line 27, change "optical system" to -- exposure apparatus --;
Line 32, change "substance;" to -- substance, --;
Line 35, change "optical system" to -- exposure apparatus --

UNITED STATES PATENT AND TRADEMARK OFFICE
CERTIFICATE OF CORRECTION

PATENT NO. : 6,714,280 B2
DATED : March 30, 2004
INVENTOR(S) : Yasuhiro Omura

It is certified that error appears in the above-identified patent and that said Letters Patent is hereby corrected as shown below:

Column 34,
Line 2, after "first" insert -- flouride -- and change "substance," to -- substance; --;
Line 10, delete "supplied".

Signed and Sealed this

Sixteenth Day of November, 2004

JON W. DUDAS
*Director of the United States Patent and Trademark Office*